United States Patent
Deutsch et al.

(10) Patent No.: US 10,564,993 B2
(45) Date of Patent: Feb. 18, 2020

(54) CONTEXTUAL DIGITAL TWIN RUNTIME ENVIRONMENT

(71) Applicant: General Electric Company, Schenectady, NY (US)

(72) Inventors: Keith Deutsch, San Ramon, CA (US); Suparna Pal, San Ramon, CA (US); Roberto Milev, San Ramon, CA (US); Kevin Yang, San Ramon, CA (US)

(73) Assignee: General Electric Company, Schenectady, NY (US)

( * ) Notice: Subject to any disclaimer, the term of this patent is extended or adjusted under 35 U.S.C. 154(b) by 71 days.

(21) Appl. No.: 15/805,272

(22) Filed: Nov. 7, 2017

(65) Prior Publication Data
US 2019/0138333 A1    May 9, 2019

(51) Int. Cl.
*G06F 9/455* (2018.01)
*G06F 8/41* (2018.01)
*G06F 9/445* (2018.01)

(52) U.S. Cl.
CPC ............ *G06F 9/45516* (2013.01); *G06F 8/41* (2013.01); *G06F 9/445* (2013.01); *G06F 9/44505* (2013.01); *G06F 9/45529* (2013.01)

(58) Field of Classification Search
None
See application file for complete search history.

(56) References Cited

U.S. PATENT DOCUMENTS

| | | | | |
|---|---|---|---|---|
| 6,983,267 B2* | 1/2006 | Hamadou | ............ | G05B 17/02 706/59 |
| 7,069,517 B2* | 6/2006 | Washington | ............ | G06F 8/34 715/763 |
| 7,181,303 B2* | 2/2007 | Scholl | ............ | G06Q 10/06 700/97 |
| 7,324,856 B1* | 1/2008 | Bromley | ............ | G05B 19/056 700/86 |
| 7,515,977 B2* | 4/2009 | Eryurek | ............ | G06F 8/34 700/83 |
| 7,590,970 B2* | 9/2009 | Bromley | ............ | G05B 19/056 700/17 |
| 8,185,219 B2* | 5/2012 | Gilbert | ............ | G06F 9/4488 700/83 |
| 8,271,943 B2* | 9/2012 | Hudson, III | ............ | G06F 8/34 717/113 |

(Continued)

*Primary Examiner* — Chat C Do
*Assistant Examiner* — Douglas M Slachta
(74) *Attorney, Agent, or Firm* — Buckley, Maschoff & Talwalkar LLC

(57) ABSTRACT

The example embodiments are directed systems and methods for managing a contextual digital twin. In one example, the method may include receiving a request message configured to trigger an action to a digital twin, the digital twin comprising a virtual representation of an asset, determining a behavior of the digital twin that is linked to the request message based on capabilities of the behavior stored with respect to the digital twin, determining input parameters of the behavior from the request message, and generating an executable script for performing the determined behavior in association with the digital twin based on the input parameters. The context can provide information about operations of the asset as well as insight into how to handle the operations based on similar occurrences to the asset or other related assets.

19 Claims, 21 Drawing Sheets

(56) References Cited

U.S. PATENT DOCUMENTS

| | | | |
|---|---|---|---|
| 9,501,208 B2* | 11/2016 | Jundt | G06F 3/0484 |
| 9,904,263 B2* | 2/2018 | Blevins | G05B 17/02 |
| 2002/0083413 A1* | 6/2002 | Kodosky | G06F 8/10 |
| | | | 717/109 |
| 2006/0259871 A1* | 11/2006 | Washington | G06F 8/34 |
| | | | 715/763 |
| 2008/0065243 A1* | 3/2008 | Fallman | G05B 19/409 |
| | | | 700/83 |
| 2008/0066004 A1* | 3/2008 | Blevins | G06F 9/4488 |
| | | | 715/771 |
| 2010/0017739 A1* | 1/2010 | Han | H04L 67/36 |
| | | | 715/772 |
| 2012/0042239 A1* | 2/2012 | O'Brien | G06F 17/248 |
| | | | 715/243 |
| 2014/0282227 A1* | 9/2014 | Nixon | G06F 17/5009 |
| | | | 715/786 |
| 2014/0337277 A1* | 11/2014 | Asenjo | G06Q 10/06 |
| | | | 707/603 |
| 2015/0081267 A1* | 3/2015 | Conroy | G06F 9/455 |
| | | | 703/21 |
| 2015/0134317 A1* | 5/2015 | Maturana | G05B 17/02 |
| | | | 703/13 |
| 2015/0186119 A1* | 7/2015 | Chouinard | G05B 19/0425 |
| | | | 717/113 |
| 2015/0193418 A1* | 7/2015 | Koska | H04L 67/10 |
| | | | 715/223 |
| 2016/0179897 A1* | 6/2016 | Zheng | G06F 16/24568 |
| | | | 707/722 |
| 2016/0274978 A1* | 9/2016 | Strohmenger | G05B 13/04 |
| 2017/0220334 A1* | 8/2017 | Hart | G06F 8/65 |

* cited by examiner

CONTEXTUAL DIGITAL TWIN RUNTIME ENVIRONMENT

BACKGROUND

Machine and equipment assets are engineered to perform particular tasks as part of a business process. For example, assets can include, among other things and without limitation, industrial manufacturing equipment on a production line, drilling equipment for use in mining operations, wind turbines that generate electricity on a wind farm, transportation vehicles, and the like. As another example, assets may include devices that aid in diagnosing patients such as imaging devices (e.g., X-ray or MRI systems), monitoring equipment, and the like. The design and implementation of these assets often takes into account both the physics of the task at hand, as well as the environment in which such assets are configured to operate.

Low-level software and hardware-based controllers have long been used to drive machine and equipment assets. However, the rise of inexpensive cloud computing, increasing sensor capabilities, and decreasing sensor costs, as well as the proliferation of mobile technologies, have created opportunities for creating novel industrial and healthcare based assets with improved sensing technology and which are capable of transmitting data that can then be distributed throughout a network. As a consequence, there are new opportunities to enhance the business value of some assets through the use of novel industrial-focused hardware and software.

In an industrial operational environment, a digital representation of an asset is made up of a variety of operational technology (OT) and information technology (IT) data management systems. Examples of OT data systems include data historian services which may maintain a history of sensor data streams from sensors attached to an asset and condition monitors that detect and store alerts and alarms related to potential fault conditions of an asset. Examples of IT data systems include enterprise resource planning (ERP) systems and maintenance record databases. Each of these systems operates in a narrow information silo with its own semantics, concerns and data storage models.

An industrial asset management application may attempt to aggregate these various sources of data and information into a centralized location in order to integrate them and apply analytics, visualization techniques, and other processes that help human operators detect issues and make decisions with respect to an asset. From a network perspective, the IT and OT data systems can be thought of as comprising the network "Edge" whereas the asset management application can be thought of as existing in the "Cloud."

However, in emerging digital industrial technologies, industrial enterprises are beginning to move from an asset management orientation to a business outcome orientation to better achieve desired results. For example, airlines are moving from a focus on purchasing and managing individual aircraft to optimizing key performance indicators (KPIs) such as cost and passenger/miles per unit of time over an operational environment which includes a fleet of aircraft, airports, employees, and the like. The application and platform requirements for providing effective decision support for such optimized business outcomes goes beyond traditional data integration, analytic and visualization approaches embodied in existing asset management solutions.

SUMMARY

The example embodiments improve upon the prior art by providing a unified platform that seamlessly encompasses the cloud and the edge and that can generate and output context with a digital twin to further enhance and support interaction with the digital twin. The result is a contextual digital twin that is capable of providing real-time situational awareness of machine data, software data, process data, and the like, and performing complex event processing at and across the edge. Furthermore, the contextual digital twin can derive actionable insight from OT and IT data systems and provide the insight with the intent to facilitate accurate and efficient responses to the issues at hand. The system provided herein is capable of gathering knowledge from the asset and determining context for decision making from an accumulation of the knowledge. Furthermore, the system can derive actions, suggestions, and the like from the context, which can be output as part of the contextual digital twin to assist a user or system with making decisions about the operation of the asset.

According to an aspect of an example embodiment, a method may include one or more of executing a digital twin which includes a virtual representation of an asset, the digital twin being executed based on data associated with the asset, determining an operational event that has occurred with respect to the asset based on the execution of the digital twin of the asset, identifying previous operational events that have occurred and that are related to the determined operational event, and generating context for the determined operational event based on the previous operational events, and outputting information for display about the generated context of the determined operational event to a display device.

According to an aspect of another example embodiment, a computing system may include one or more of a processor which may run a digital twin which includes a virtual representation of an asset, the digital twin being executed based on data associated with the asset determine an operational event that has occurred with respect to the asset based on the execution of the digital twin of the asset, identify previous operational events that have occurred and that are related to the determined operational event, and generate context for the determined operational event based on the previous operational events, and an output that may output information for display about the generated context of the determined operational event to a display device.

According to an aspect of an example embodiment, a method may include one or more of receiving a request message configured to trigger an action to a digital twin, the digital twin including a virtual representation of an asset, determining a behavior of the digital twin that is linked to the request message based on capabilities of the behavior stored with respect to the digital twin, determining input parameters of the behavior from the request message, and generating an executable script for performing the determined behavior in association with the digital twin based on the input parameters.

According to an aspect of another example embodiment, a computing system may include one or more of a receiver that may receive a request message configured to trigger an action to a digital twin, the digital twin comprising a virtual representation of an asset, and a processor that may determine a behavior of the digital twin that is linked to the request message based on capabilities of the behavior stored with respect to the digital twin, determine input parameters of the behavior from the request message, and generate an executable script for performing the determined behavior in association with the digital twin based on the input parameters.

According to an aspect of an example embodiment, a method may include one or more of storing a digital twin template as a graph model in a database, the digital twin template configured to instantiate a virtual representation of an asset, receiving a request to execute a behavior in association with an instance of a digital twin corresponding to the digital twin template, determining a position within the graph model of the digital twin template at which the behavior is bound to the digital twin template, and executing the behavior based on the position within the graph model at which the behavior is bound to perform an action with respect to the instance of the digital twin.

According to an aspect of another example embodiment, a computing system may include one or more of a storage that may store a digital twin template as a graph model, the digital twin template configured to instantiate a virtual representation of an asset, and a processor that may receive a request to execute a behavior in association with an instance of a digital twin corresponding to the digital twin template, determine a position within the graph model of the digital twin template at which the behavior is bound to the digital twin template, and execute the behavior based on the position within the graph model at which the behavior is bound to perform an action with respect to the instance of the digital twin.

Other features and aspects may be apparent from the following detailed description taken in conjunction with the drawings and the claims.

BRIEF DESCRIPTION OF THE DRAWINGS

Features and advantages of the example embodiments, and the manner in which the same are accomplished, will become more readily apparent with reference to the following detailed description taken in conjunction with the accompanying drawings.

Figure 1:
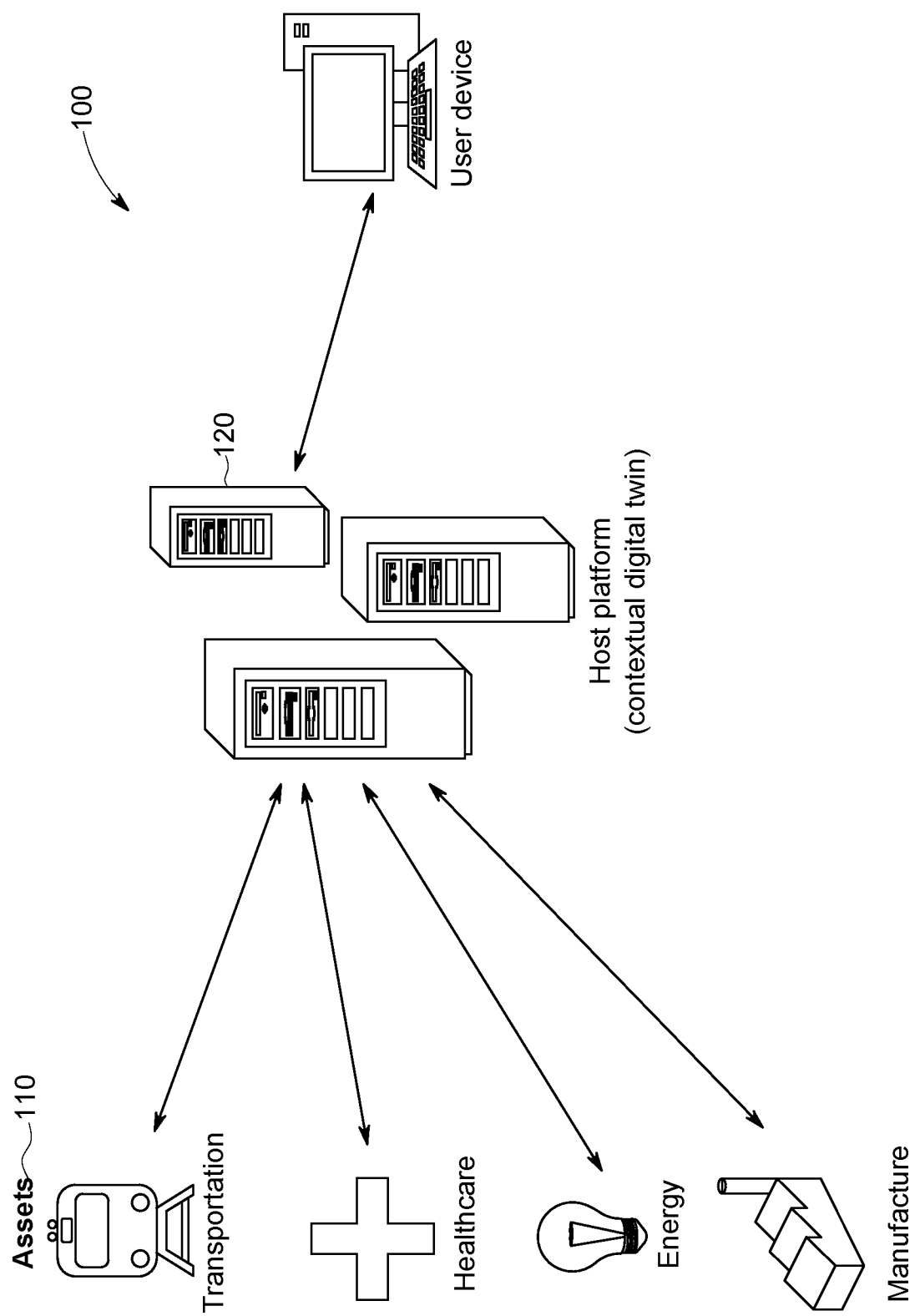
FIG. 1 is a diagram illustrating a cloud computing environment in accordance with an example embodiment.

Throughout the drawings and the detailed description, unless otherwise described, the same drawing reference numerals will be understood to refer to the same elements, features, and structures. The relative size and depiction of these elements may be exaggerated or adjusted for clarity, illustration, and/or convenience.

DETAILED DESCRIPTION

In the following description, specific details are set forth in order to provide a thorough understanding of the various example embodiments. It should be appreciated that various modifications to the embodiments will be readily apparent to those skilled in the art, and the generic principles defined herein may be applied to other embodiments and applications without departing from the spirit and scope of the disclosure. Moreover, in the following description, numerous details are set forth for the purpose of explanation. However, one of ordinary skill in the art should understand that embodiments may be practiced without the use of these specific details. In other instances, well-known structures and processes are not shown or described in order not to obscure the description with unnecessary detail. Thus, the present disclosure is not intended to be limited to the embodiments shown, but is to be accorded the widest scope consistent with the principles and features disclosed herein.

The concept of a digital twin is well known, but prior digital twin technologies have focused on physics based modeling and machine learning techniques to create operational twins that could be used, for example, for failure prediction. The example embodiments go beyond that singular model to focus on a semantic digital twin model (referred to herein as the contextual digital twin) which can encompass a multiplicity of aspects of the asset, including structural models, physical process models, software process models, as well as modeling other entities in the environment such as people, organizations, facilities, etc. Because the model is semantic in nature, it can encompass hierarchies of assets and rich relationship modeling between the assets as well as between assets and other entities. The contextual aspect of the example embodiments derives from the further modeling of information, state and condition flows of the asset over time which provide a continual aggregation of knowledge with respect to assets and their environment throughout their lifecycle. In this way, the contextual digital twin can provide a living model that drives business outcomes.

According to various aspects, a contextual digital twin may be used to virtually model an asset while also provide context that is associated with the asset. A digital twin may include a virtual representation of an asset which may include a virtual replication of hardware, software, processes, and the like. As an example, an asset may include a physical asset such as a turbine, jet engine, windmill, oil rig, healthcare machine, or the like. As additional examples, an asset may include a software asset (e.g., an application, an analytic, a service, etc.), a system of hardware and/or software (also referred to as a system of things), a physical process, an actor such as a human operator, weather, and the like. A contextual digital twin may include context of one or more of these assets incorporated within the virtual representation of the asset.

The context may be determined based on knowledge that is acquired from the asset (or the digital twin of the asset) and that is accumulated over time. For example, a digital twin may generate an alert or other warning based on a change in operating characteristics of the asset. The alert may be due to an issue with a component of the asset. In addition to the alert, the contextual digital twin may generate context that is associated with the alert. For example, the contextual digital twin may determine similar issues that have previously occurred with the asset, provide a description of what caused those similar issues, what was done to address the issues, and differences between the current issue and the previous issues, and the like. As another example, the context can provide suggestions about actions to take to resolve the current issue.

Assets may be outfitted with one or more sensors (e.g., physical sensors, virtual sensors, etc.) configured to monitor respective operations or conditions of the asset and the environment in which the asset operates. Data from the sensors can be recorded or transmitted to a cloud-based or other remote computing environment. By bringing such data into a cloud-based computing environment, new software applications informed by industrial process, tools and know-how can be constructed, and new physics-based analytics specific to an industrial environment can be created. Insights gained through analysis of such data can lead to enhanced asset designs, enhanced software algorithms for operating the same or similar assets, better operating efficiency, and the like.

The contextual digital twin may be used in conjunction with applications and systems for managing machine and equipment assets and can be hosted within an Industrial Internet of Things (IIoT). For example, an IIoT may connect physical assets, such as turbines, jet engines, locomotives, healthcare devices, and the like, software assets, processes, actors, and the like, to the Internet or cloud, or to each other in some meaningful way such as through one or more networks. The system described herein can be implemented within a "cloud" or remote or distributed computing resource. The cloud can be used to receive, relay, transmit, store, analyze, or otherwise process information for or about assets. In an example, a cloud computing system includes at least one processor circuit, at least one database, and a plurality of users and assets that are in data communication with the cloud computing system. The cloud computing system can further include or can be coupled with one or more other processor circuits or modules configured to perform a specific task, such as to perform tasks related to asset maintenance, analytics, data storage, security, or some other function.

While progress with industrial and machine automation has been made over the last several decades, and assets have become 'smarter,' the intelligence of any individual asset pales in comparison to intelligence that can be gained when multiple smart devices are connected together, for example, in the cloud. Aggregating data collected from or about multiple assets can enable users to improve business processes, for example by improving effectiveness of asset maintenance or improving operational performance if appropriate industrial-specific data collection and modeling technology is developed and applied.

The integration of machine and equipment assets with the remote computing resources to enable the IIoT often presents technical challenges separate and distinct from the specific industry and from computer networks, generally. To address these problems and other problems resulting from the intersection of certain industrial fields and the IIoT, the example embodiments provide a contextual digital twin that is capable of providing context in addition to a virtual representation of an asset. The context can be used to trigger actions, insight, and events based on knowledge that is captured and/or reasoned from the operation of an asset or a group of assets.

The Predix™ platform available from GE is a novel embodiment of such an Asset Management Platform (AMP) technology enabled by state of the art cutting edge tools and cloud computing techniques that enable incorporation of a manufacturer's asset knowledge with a set of development tools and best practices that enables asset users to bridge gaps between software and operations to enhance capabilities, foster innovation, and ultimately provide economic value. Through the use of such a system, a manufacturer of industrial or healthcare based assets can be uniquely situated to leverage its understanding of assets themselves, models of such assets, and industrial operations or applications of such assets, to create new value for industrial customers through asset insights.

The example embodiments provide a system that can create and run full lifecycle digital twin models of all active entities in an industrial environment including, but not limited to, physical assets and systems of assets, software and physical processes, actors, resources, and the like. The digital twin models may incorporate behaviors that enable fine grained and iterative responsiveness via a distributed fabric which incorporates the cloud and both IT and OT edge through a seamless integration. The example embodiments further provide a contextual digital twin runtime environment that incorporates an industrial knowledge framework for ongoing aggregation of richly correlated holistic knowledge from across disparate systems and data sources. The industrial knowledge framework provides the context which enables the transformation of data into actionable insight with respect to an asset or an asset environment.

In the consumer space, companies such as GOOGLE®, BING®, APPLE®, and others have pioneered a knowledge graph technology to address the consumer analogs of these concerns and power intelligent search and intelligent assistants such as SIM®, CORTANA®, and the like. However, creating a knowledge framework for industrial businesses such as manufacturing, oil and gas, power, aviation, chemical production, healthcare, mining, and the like, poses some unique challenges that are not present in the consumer space including the variety of data, accuracy of an answer (as a wrong decision can have major human and financial consequences), data governance and ownership, and the like. The notion of an industrial knowledge graph as described herein can be used to create artificial intelligence applications that provide answers to complex and unanticipated questions leading to actionable insights across a broad class of correlated functional domains such as maintenance optimization, asset utilization, supply chain optimization, and the like.

As described in various examples herein, data may include a raw collection of related values of an asset or a process including the asset, for example, in the form of a stream (in motion) or in a data storage system (at rest). Individual data values may include descriptive metadata as to a source of the data and an order in which the data was received, but may not be explicitly correlated information may refer to a related collection of data which is imputed to represent meaningful facts about an identified subject. As a non-limiting example, information may be a dataset such as a dataset which has been determined to represent temperature fluctuations of a machine part over time.

Knowledge may include a correlation or a set of correlations between a multiplicity of information elements, which may be represented as an ontologically defined relationship and which may reflect current or historic state or condition. Knowledge may include information about an asset or a resource, worker, artefact, or the like. A reasoned conclusion (or insight) may be automatically imputed by the system from generated knowledge. As a non-limiting example, an imputation may be that this person has read a particular document from which the assertion that the referenced person is aware of the existence of the particular document can be imputed. A domain event may refer to a particular type of knowledge artifact received by or otherwise generated by the system which models state or status of an entity in time, and which has event specific contextualizing semantics related to the operation of an asset such as "this actor took this action with respect to this asset in accordance with this business process at this time."

A domain event is a semantically integrated, or contextualized record within the contextual digital twin of an operational event within the system and can be used to identify and model an operational event and data associated therewith. As a non-limiting example, an operational event may include an event that affects the physical operation of the asset and which generates an issue/case with respect to the asset. Operational events may include damage, failure warnings, a determination that a replacement part is needed, and the like. As another example, an operational event may include a maintenance operation that is performed on the asset as well as information about the maintenance operation (e.g., description of the maintenance, by who, what documents/tools were used to perform such event, etc.). The contextual digital twin system may identify previous operational events and generate context around those events. In addition, the contextual digital twin may also produce domain events (e.g., in the software domain) that correspond to an operational event associated with the actual asset. Furthermore, the execution of the digital twin also produces and contextualizes operational event records.

Context may refer to an accumulation of knowledge related to a subject (e.g., an asset, component of the asset, a case involving the asset, an event, etc.) which can be reasoned over to provide subject-specific insight. Context may be generated by acquiring knowledge with an intent to provide a specific solution or set of solutions for a particular problem or issue. As a non-limiting example, context about an asset provided with a digital twin may include insight such as similarly matching events and operations that have previously occurred to the asset (or similar type assets) as well as suggestions about how to handle a current event, and the like.

The contextual digital twin operates within a runtime environment. The runtime environment includes a graph storage for storing templates of digital twins as graph constructs. The runtime environment also includes an integrated fabric which stores a number of services which interact with the graph storage and which also execute the contextual digital twin. The execution of the contextual digital twin is invoked by programmatic behaviors which are simply referred to herein as "behaviors." The twin runtime environment enables the behaviors.

Behavioral programming is an approach to software development, which is aligned with how people often describe a systems' behavior. The behavioral application described herein may include methods or threads of behavior which may represent an independent scenario that the system should and/or shouldn't follow. The behaviors may be interwoven at run-time yielding integrated system behavior. Behaviors can include instantiating a contextual digital twin, configuring the contextual digital twin, operational behaviors triggering an action to the contextual digital twin, template behaviors, and the like. In addition, execution of a first behavior can trigger execution of additional behaviors. For example, instantiation of an assembly of a digital twin can recursively trigger instantiation of a sub-assembly of the digital twin which can further trigger instantiation of a component of the sub-assembly, and the like.

FIG. 1 illustrates a cloud computing system 100 for industrial software and hardware in accordance with an example embodiment. Referring to FIG. 1, the system 100 includes a plurality of assets 110 which may be included within an IIoT and which may transmit raw data to a source such as cloud computing platform 120 where it may be stored and processed. It should also be appreciated that the cloud platform 120 in FIG. 1 may be replaced with or supplemented by a non-cloud based platform such as a server, an on-premises computing system, and the like. Assets 110 may include hardware/structural assets such as machine and equipment used in industry, healthcare, manufacturing, energy, transportation, and that like. It should also be appreciated that assets 110 may include software, processes, actors, resources, and the like. A digital model (i.e., digital twin) of an asset 110 may be generated and stored on the cloud platform 120. The digital twin may be used to virtually represent an operating characteristic of the assets 110. The digital twin may also generate context associated with the operation of the asset 110 and output the context in a format that is capable of being consumed by an operator, a system, a software, etc.

The data transmitted by the assets 110 and received by the cloud platform 120 may include raw time-series data output as a result of the operation of the assets 110, and the like. Data that is stored and processed by the cloud platform 120 may be output in some meaningful way to user devices 130. In the example of FIG. 1, the assets 110, cloud platform 120, and user devices 130 may be connected to each other via a network such as the Internet, a private network, a wired network, a wireless network, etc. Also, the user devices 130 may interact with software hosted by and deployed on the cloud platform 120 in order to receive data from and control operation of the assets 110.

According to various aspects, software applications that can be used to enhance or otherwise in used in conjunction with the operation of an asset and a digital twin of the asset may be hosted by the cloud platform 120 and may interact with the asset. For example, software applications may be used to optimize a performance of an asset or data coming in from the asset. As another example, the software applications may analyze, control, manage, or otherwise interact with the asset and components (software and hardware) thereof. A user device 130 may receive views of data or other information about the asset as the data is processed via one or more applications hosted by the cloud platform 120. For example, the user device 130 may receive graph-based results, diagrams, charts, warnings, measurements, power levels, and the like. As another example, the user device 130 may display a graphical user interface that allows a user thereof to input commands to an asset via one or more applications hosted by the cloud platform 120.

In this example, an asset management platform (AMP) can reside within or be connected to the cloud platform 120, in a local or sandboxed environment, or can be distributed across multiple locations or devices and can be used to interact with the assets 110. The AMP can be configured to perform functions such as data acquisition, data analysis, data exchange, and the like, with local or remote assets, or with other task-specific processing devices. For example, the assets 110 may be an asset community (e.g., turbines, healthcare, power, industrial, manufacturing, mining, oil and gas, elevator, etc.) which may be communicatively coupled to the cloud platform 120 via one or more intermediate devices such as a stream data transfer platform, database, or the like.

Information from the assets 110 may be communicated to the cloud platform 120. For example, external sensors can be used to sense information about a function of an asset, or to sense information about an environment condition at or around an asset, a worker, a downtime, a machine or equipment maintenance, and the like. The external sensor can be configured for data communication with the cloud platform 120 which can be configured to store the raw sensor information and transfer the raw sensor information to the user devices 130 where it can be accessed by users, applications, systems, and the like, for further processing. Furthermore, an operation of the assets 110 may be enhanced or otherwise controlled by a user inputting commands though an application hosted by the cloud platform 120 or other remote host platform such as a web server. The data provided from the assets 110 may include time-series data or other types of data associated with the operations being performed by the assets 110

In some embodiments, the cloud platform 120 may include a local, system, enterprise, or global computing infrastructure that can be optimized for industrial data workloads, secure data communication, and compliance with regulatory requirements. The cloud platform 120 may include a database management system (DBMS) for creating, monitoring, and controlling access to data in a database coupled to or included within the cloud platform 120. The cloud platform 120 can also include services that developers can use to build or test industrial or manufacturing-based applications and services to implement IIoT applications that interact with assets 110.

For example, the cloud platform 120 may host an industrial application marketplace where developers can publish their distinctly developed applications and/or retrieve applications from third parties. In addition, the cloud platform 120 can host a development framework for communicating with various available services or modules. The development framework can offer developers a consistent contextual user experience in web or mobile applications. Developers can add and make accessible their applications (services, data, analytics, etc.) via the cloud platform 120. Also, analytic software may analyze data from or about a manufacturing process and provide insight, predictions, and early warning fault detection.

Figure 2:
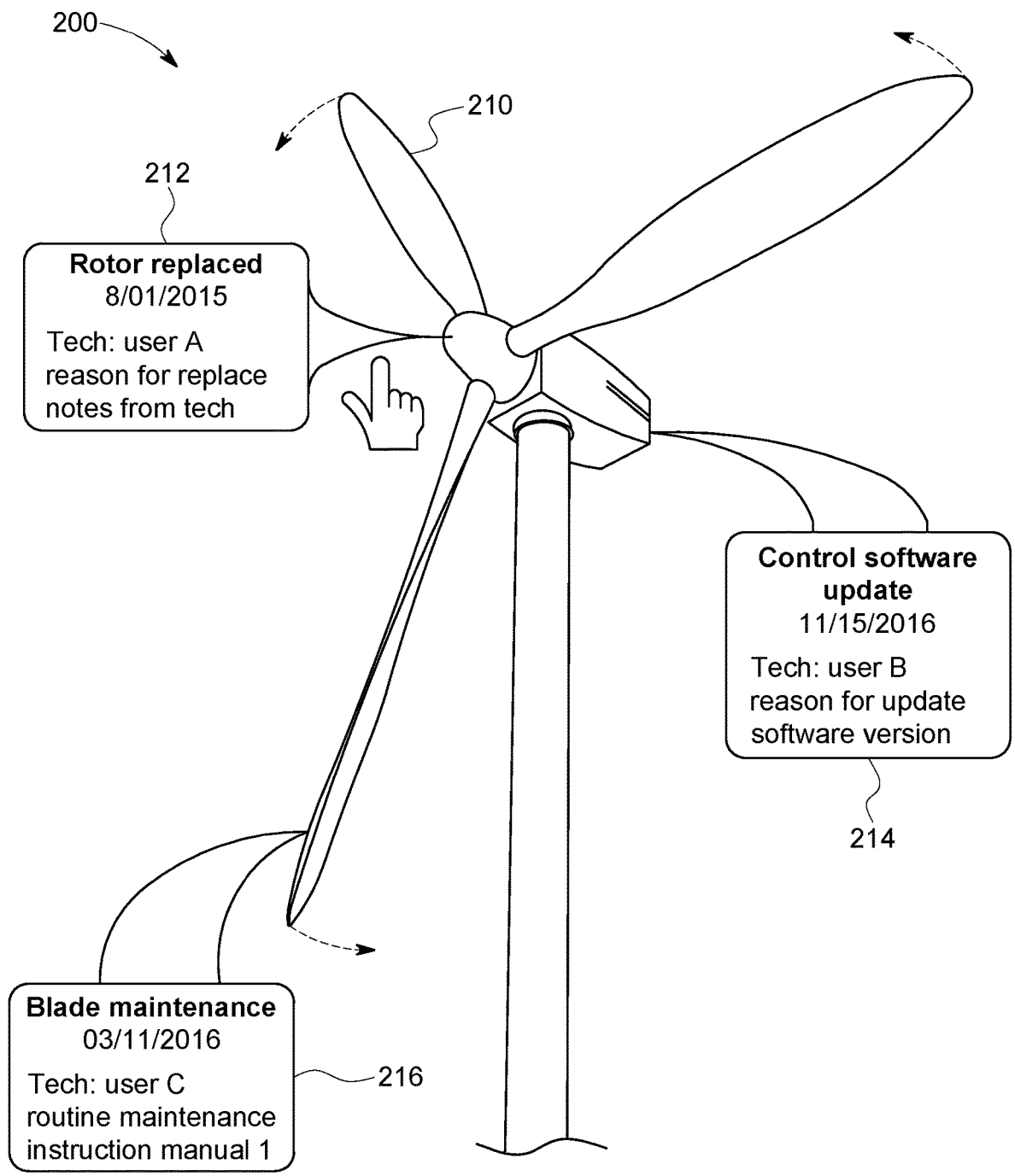
FIG. 2 is a diagram illustrating a digital twin having knowledge associated therewith in accordance with an example embodiment.

FIG. 2 illustrates a digital twin 200 having knowledge associated therewith in accordance with an example embodiment. The digital twin 200 may be a virtual representation of an actual asset such as a physical asset (machine or equipment), a software asset (program, application, analytic, etc.), an actor (e.g., person, weather, etc.), a resource (e.g., manual, instructions, etc.), and the like. That is, the digital twin 200 may include a virtual model 210 of the asset as well as knowledge elements 212, 214, and 216 associated with the asset. As further described herein, the knowledge elements 212, 214, and 216 may be data provided from operators, applications, and other means which provide information about the operation of the asset. The system running the digital twin 200 may receive data from the asset itself as well as from any other sources having data associated with the asset (e.g., databases, servers, users, etc.) and drive the virtual operation/execution of the digital twin 200 based on the received information. In some instances, the digital twin 200 may include a system of digital twins representing a plurality of different assets. In the example of FIG. 2, the digital twin 200 includes a virtual model 210 of a wind turbine.

As the actual wind turbine operates, sensors and other information retrieval systems can acquire information from and about the wind turbine and feed the information to a system (e.g., cloud platform 120 in FIG. 1) which is running the digital twin 200. The system may in-turn simulate the operation of the virtual model 210 of the wind turbine by causing the virtual model 210 to operate in virtual space. As events and other actions occur with respect to the asset in physical space, the information associated therewith may be stored and/or fed back to the digital twin 200. For example, operations such as repairs, maintenance, optimizations, part replacements, cleanings, inspections, and the like, may be stored as knowledge in association with the asset. The knowledge may be displayed as knowledge elements 212, 214, and 216 which are incorporated within the visual representation of the virtual model 210 of the asset.

As a non-limiting example, the knowledge elements 212, 214, and 216 may include descriptions of operational events that have occurred to the wind turbine. Examples of operational events include a rotor being replaced (element 212) along with a description of the reason for replacing the rotor, a date of the replacement, a name of the technician that replaced the rotor, and notes provided from the technician. As another example, operational events may include a software update (element 214) to a control system indicating that a control software update was performed, the name of the technician that performed the update, the reasons for the update, a date of the update, and the like. As yet another non-limiting example, an operational event may include a maintenance performed (element 216) on the blade of the wind turbine, a reason for the maintenance, a tech that performed the maintenance, a date of the maintenance and the like.

The knowledge elements may be used to generate context associated with the asset, as further described in the examples herein. The knowledge itself may be input through a user interface by one or more operators. For example, a user may type in a description of what was performed and why. The user may also type in parts that were replaced, reasons for the issue with the asset, the response when the changes were made, and the like. As another example, the knowledge may be collected by an application that identifies changes in the asset and responses made to those changes. The knowledge may be received in real-time or it may be collected at intervals (e.g., periodic, random, etc.) by the system.

Figure 3:
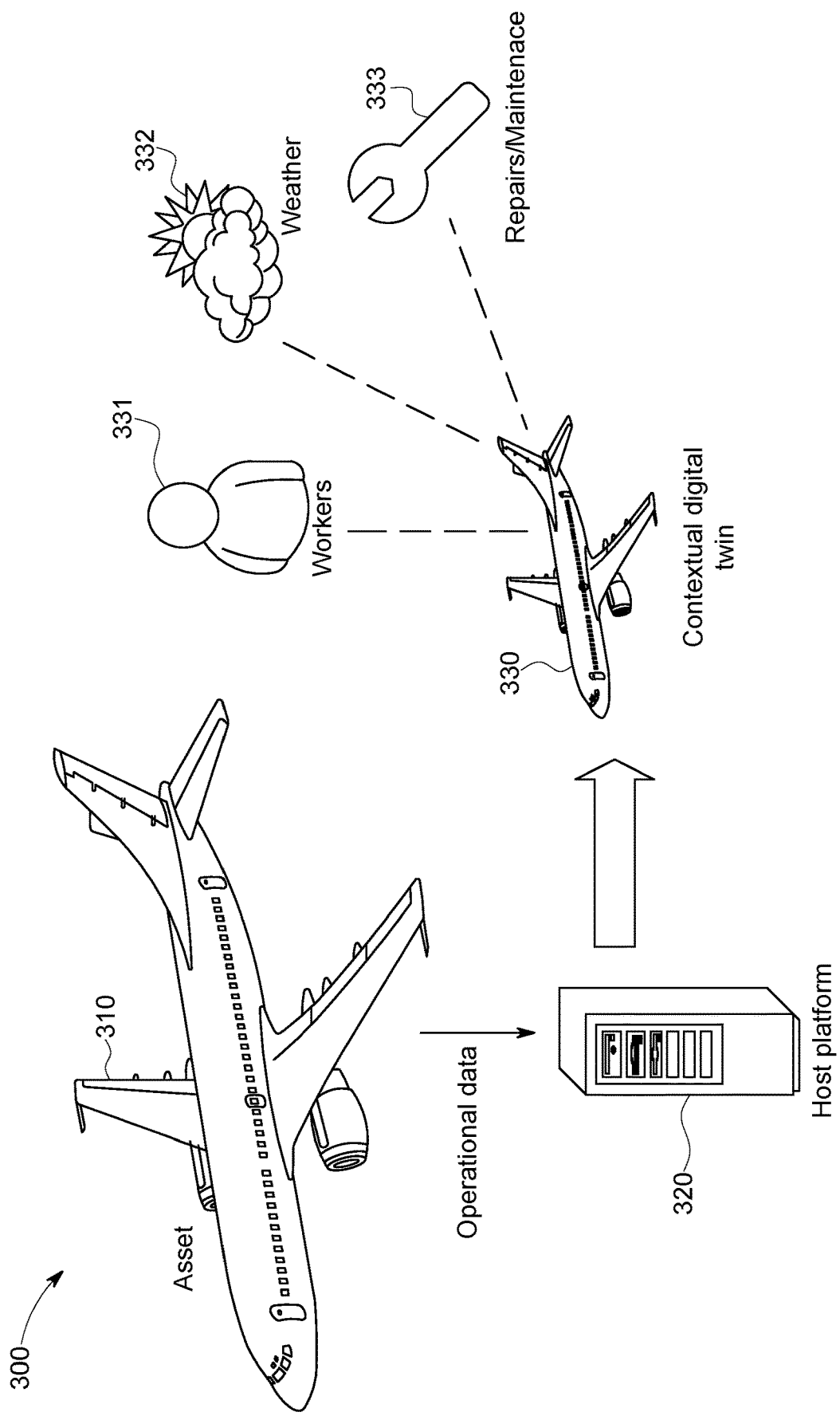
FIG. 3 is a diagram a process of generating a contextual digital twin in accordance with an example embodiment.
Figure 4:
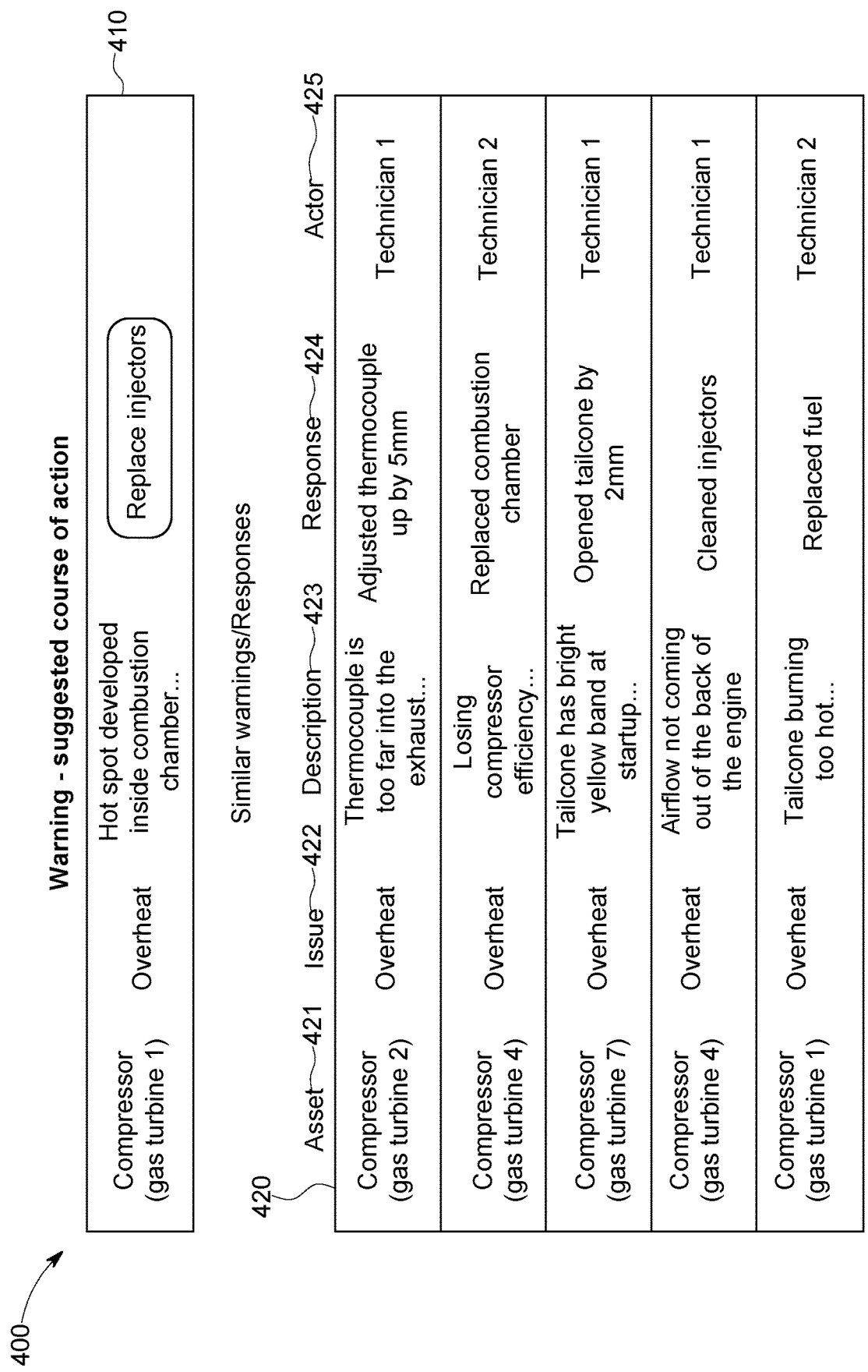
FIG. 4 is a diagram illustrating context that may be output from a digital twin in accordance with an example embodiment.

FIG. 3 illustrates a process 300 of generating a contextual digital twin in accordance with an example embodiment, and FIG. 4 illustrates an example of context 400 that can be generated and output by a contextual digital twin. Referring to FIG. 3, an asset 310 includes a jet airplane. As the asset operates, characteristics and other information about the jet airplane in operation such as speed, distance travelled, altitude, fuel consumption, weight, acceleration, weather, pressure, and other information are transmitted to a host platform 320 which hosts a contextual digital twin 330 of the jet airplane. In addition to operational information, operational events such as maintenance, repairs, optimizations, replacements, upgrades, damage, weather-related events, and the like, can be fed back to the host platform 320 to provide additional knowledge about the asset 310. In the example of FIG. 3, the host platform 320 may be a cloud platform, also referred to as a cloud, and the asset 310 may be a data source which may be referred to as a cloud edge and may include additional components such as a network, devices, applications, etc.

According to various aspects, the contextual digital twin 330 may include a virtual model of the jet airplane asset 310. In addition, the contextual digital twin may include or may communicate with digital twins of other elements associated with the asset 310 such as actor/workers 331 who work on the asset 310 and make decisions with respect to the asset 310, weather information 332 that occurs as the asset 310 is operating, repairs and maintenance 333 that occur to the asset, and the like. Other elements not shown may also be modeled or included in the knowledge associated with the contextual digital twin 330. Over time, the knowledge elements may be accumulated to generate context. The context may be output along with the digital model of the contextual digital twin 330 to thereby provide a richer and fuller representation (e.g., a living model) of the asset 310.

One of the benefits of the contextual digital twin is the ongoing aggregation and contextualization of knowledge. Industrial knowledge provides semantic information for surfacing relevant insights, relationships and trends related to the operational context for decision making, for example, to quickly understand root causes, spot early trends, etc. as opposed to the existing results from analytics which are difficult to relate to the operational context and hence introduce high ratio false positive/negative. There are various types of industrial knowledge that may be captured or reasoned from data sources, events or knowledge sources (human or machine insights) etc. All of this knowledge can be critical to optimize decision-making in industrial domains. As more types of knowledge are created, the time to value for decision-making is accelerated.

Knowledge elements are semantic constructs which are associated with one or more digital twin instances and which represent contextualized information with respect to those instances which may be aggregated throughout the instance lifecycle. The example embodiments contemplates two broad classes of such knowledge which include domain events (events affecting the operation of an asset) and information resources such as manuals, comments, documents, resources, etc., which can be used with respect to the operation of an asset. Some of the key knowledge types are listed as following:

Human expertise from a broad range of problems across wide variety of industrial domains, for example, failure modes or anomalies of assets, systems and operations across the fleets. The information is captured in reusable blueprints with no need to build from scratch.

Structured and unstructured data sources, for example, case data, field inspections, maintenance and conversation logs, etc. contain rich information about root causes and problem resolutions.

Operational data sources, for example, time series sensor data, faults, events, etc. that feed analytics and derived insights that are useful to users. This knowledge typically is captured in relation to a given asset or system, e.g. anomaly events, predictions, etc. The "inferred relationships" between types of assets (similar assets) can be created as well.

"Unknown Unknown" discovery using unsupervised artificial intelligence techniques to replace analyst-built ontologies/dictionaries and remove the bias inherent in ontologies created by domain experts who come to table with preconceived hypotheses and processes. One example of "Unknown Unknown" is the wheel misalignment problems of locomotive engine caused by a specific conductor pushing a brake too hard.

Dynamic expansion of knowledge derived from continuous learning and adaptation based on operation condition changes and user feedback. For example, reasoning over new learning produces updates to a feature vector defined in a blueprint to provide more accurate predictions for a failure mode.

As further described in the non-limiting example of FIG. 4, knowledge about an asset may be accumulated to generate context for the asset or a component of the asset which can be used to provide insight to an operator or a machine or software. In the example of FIG. 4, the asset includes a physical asset (i.e., a gas turbine) which may be used in at a plant such as a manufacturing plant. As operational events occur with respect to the asset, knowledge associated with the operational events may be stored and accumulated by the system which hosts a digital twin of the asset (e.g., host platform 320). Operational events may include actions, events, occurrences, and the like, which have affected or which may affect the operating characteristics of the asset. In the example of the gas turbine, operational events may include any event on the gas turbine that has caused or that is predicted to cause an issue with the asset such as a failure of a component, a deterioration of a component, an upgrade that is available, a case being opened, or the like.

When a new operational event occurs, or is predicted to occur in the future (e.g., by an analytic operating in conjunction with the asset), the system may provide context associated with the new operational event. The context may include a description of previous operational events that have occurred and which are similar to the current operational event that has occurred or that is predicted to occur, a description of the previous operational events, a cause of the previous operational events, a response to the previous operational events, a result of the response, a description of the differences between the current operational event and the previous operational events, and the like. In addition, the context may further include suggestions indicating suggested courses of action to be taken or performed by the operator that are reasoned from previous knowledge captured of the asset. In some embodiments, an operator may further query the context and receive answers to specific questions about the asset.

In FIG. 4, the new operational event comprises a warning 410 of a current operational event (or predicted future event) indicating that a compressor on a gas turbine is likely to overheat causing damage to the gas turbine. The warning may be determined based on data collected from the gas turbine and/or other sources of data associated with the gas turbine which may be collected in real-time. The warning 410 may be provided as an output with a digital twin that is being output of the gas turbine. The warning 410 may also be output with context that is associated with the warning 410, thereby generating a contextual digital twin. The context may be associated with the current event and/or previous events. In this non-limiting example, the context includes similar overheat events 420 that occurred to assets 421 which may include the same gas turbine, a different gas turbine of the same type, a different asset altogether, and the like. For example, there are situations in which a warning or other issue may be generated in which there are no other such similar warnings for the particular type of asset. However, the contextual digital twin may identify a similar warning in another type of asset (e.g., a compressor on an oil rig) which dealt with a similar issue based on characteristics of the current issue associated with the gas turbine.

In addition to providing a listing of previous overheat events 420 that are similar to a current overheat event 410, the context can provide an indication of the event 422, a description 423 of what caused the event, what was done in response 424 to the event, and by who 425 the response was performed (or what machine or equipment was used). Other examples of context that may be provided by the contextual digital twin include, but are not limited to, the result of the response taken, a time/date of the event, a description of the differences between the previous similar events and the current event, whether the response was successful, and the like. In addition to providing context of other previous similar events 420, the contextual digital twin may also suggest a course of action 411 to be taken with the current operational event 410 (i.e., overheat). As another example, the suggested course of action may also suggest a specific operator, machine, equipment, etc. to be used to perform the suggested course of action based on the other previous similar events.

Figure 5:
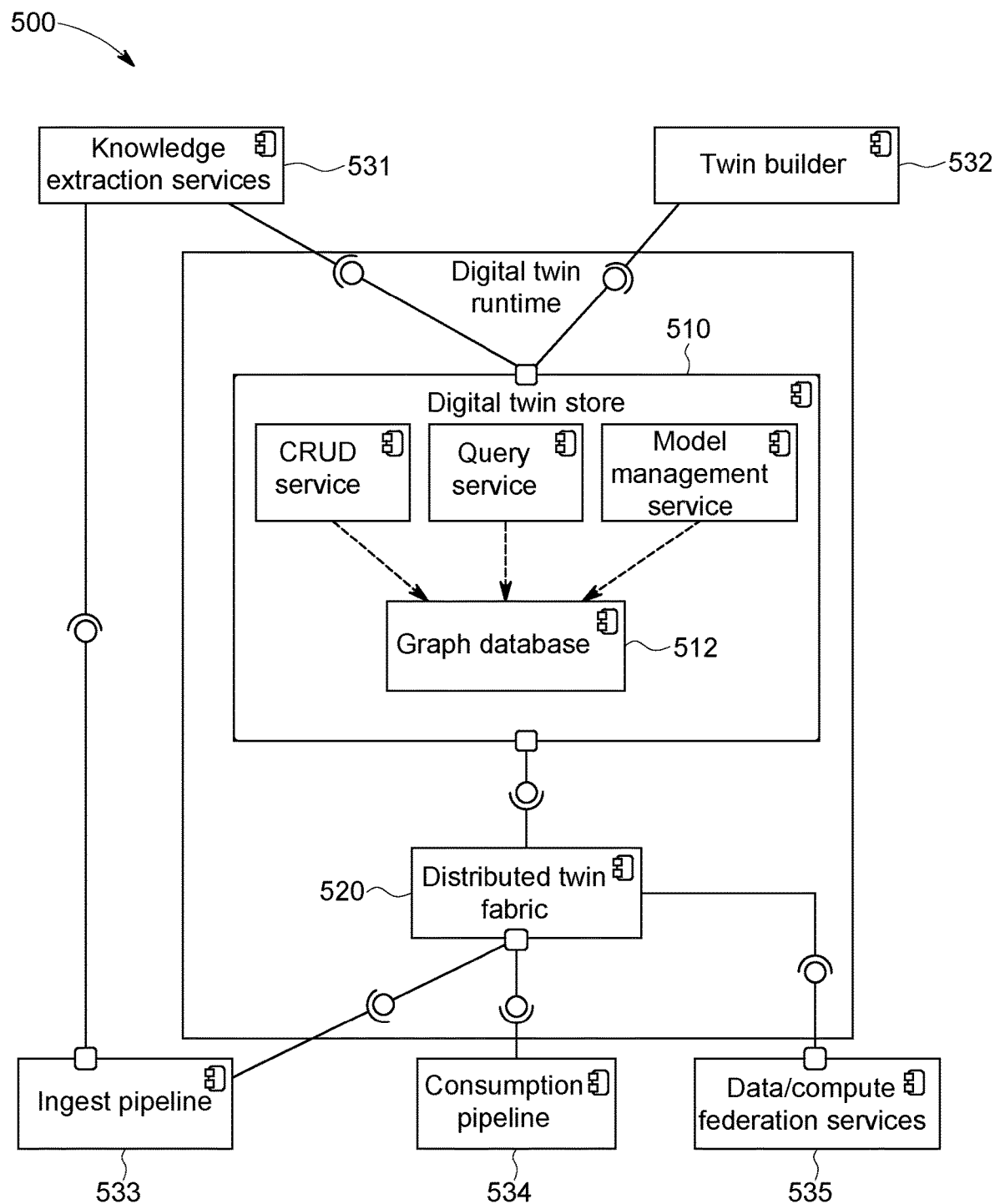
FIG. 5 is a diagram illustrating an overview of a contextual digital twin platform architecture in accordance with an example embodiment.

The contextual digital twin is specified in terms of a model and a twin runtime environment. The runtime includes a twin storage and a distributed twin fabric as described below. However, to understand the operation of, and value provided, it is important to understand the overall systems environment within which the digital twin operates. One such systems environment is illustrated in the platform overview architecture 500 an example of which is illustrated in FIG. 5. Referring to FIG. 5, digital twin storage 510 provides persistence and access for twin artifacts created in accordance with a twin ontology definition. The twin artifacts are also referred to as templates which are naturally of the form of a graph, and thus, the twin runtime environment is built around a graph database 512 included within the twin storage 510. The twin storage 510, together with a set of services for creating, discovering, accessing and managing twin artifacts stored in the graph database 512 are included in the twin runtime environment.

As shown in the platform architecture 500 overview, a distributed twin fabric 520 provides the principal connector between the twin storage subsystem 510 and the primary supporting systems of the overall platform. The distributed fabric 520 is the active element in the digital twin programming model. The fabric 520 may include an integrated fabric that seamlessly connects a cloud platform hosting the digital twin and including the digital twin storage 510 and the cloud edge where data is provided from an asset or other source.

The subsystems that support the twin runtime environment include knowledge extraction services 531, twin builder 532, ingestion pipeline 533, consumption pipeline 534, and federated compute services 535. One common occurrence in the creation and operation of digital industrial systems is the introduction or incorporation of new data sources form existing or new systems of record. These new data artifacts may not form into existing semantics supported by the twin ontology definition. The role of knowledge extraction services 531 is to bridge that gap to enable ingestion of knowledge artifacts from these new data sources which can include instruction manuals, repair orders, work orders, operator notes, comments, and the like. The result of knowledge extraction is to turn raw data sources into "semantic models" about the data sources including domain features (assets, tags, inspection events, etc.), and semantic relationships of data sources (temporal, asset association), etc. The new semantic models may then be used as a basis for extending the existing ontology definition to enable the generation of new types of knowledge artifacts in the twin runtime.

Prior to deployment as a twin runtime instance, twin templates are designed and stored externally. The twin builder 532 is an application which provides the means to create new twin templates, browse a marketplace of existing twin templates and acquire and customize them, and ultimately load such twin templates as instances within the runtime environment. The ingestion pipeline 533 connects to data from a variety of sources (systems of record), in a variety of formats, and via a variety of interfaces, including push, pull, and streaming. Once the data is acquired, are series of processing may occur such as profiling (data type detection, statistics, distributional analysis), indexing (search, query data sources), classification (domain specific classifications), etc. Ultimately, one of the goals of ingestion is to produce new knowledge artifacts in the twin runtime environment. These artifacts provide a flow of new inputs to be reasoned over. For example, digestion processes as described below will incorporate these new Knowledge Artifacts into bigger contexts in the knowledge graph.

The consumption pipeline 534 provides various interfaces and skills to search and explore knowledge semantically and visualize the results. For example, users can perform semantic searches for similar assets based on case data, operational conditions, ambience conditions, and the like. The consumption interfaces can be restful APIs, search UI, speech/NLP processing, AR/VR, etc. Another goal of the twin runtime is to act as the central source and semantic arbiter of twin artifacts, behaviors, and knowledge artifacts and the web of interconnecting relationships. However, it is not intended to provide comprehensive data storage and compute resources. For example, a knowledge artifact in the twin runtime may represent a case document and its relationships. However, while the knowledge artifact will store all required meta data about the document (including its location), in most cases the full content of that document is stored in an external system such as a document management system. This is referred to as federated data. Similarly, a behavior may require sophisticated lexical analysis of the document. This analysis is requested by the behavior script, but the actual computation happens externally, e.g. in the document management system. This is federated compute. In this way, the twin runtime depends on a variety of federated systems to do the "heavy lifting" with respect to compute and storage. All such federation is arbitrated by the federation services 535 component.

Figure 6:
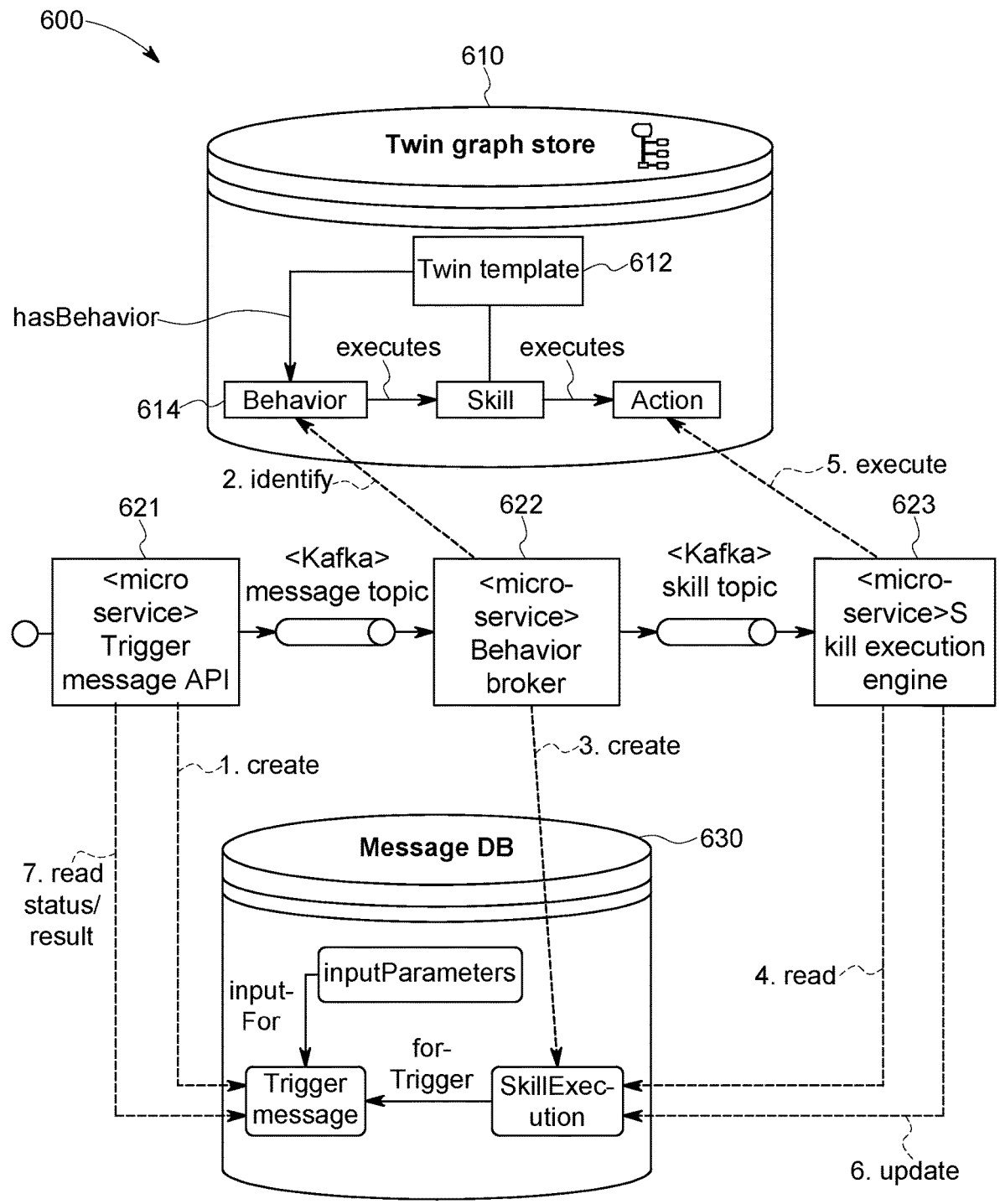
FIG. 6 is a diagram illustrating a contextual digital twin runtime environment in accordance with an example embodiment.

FIG. 6 illustrates an example of a contextual digital twin runtime environment 600 in accordance with an example embodiment. In this example, the runtime environment 600 includes the twin graph store 610 which corresponds to the graph database 512 in FIG. 5 and a message database 630 which may be included within the distributed fabric 520 shown in FIG. 5. This embodiment may include a plurality of services that perform a trigger message service 621, a behavior broker 622, and a skill execution engine 623. The services may be hosted in the distributed fabric and may be interconnected by a messaging bus such as Kafka. The services may persist records in the message database 630 which may be a SQL database, or the like. The interoperation of these components in receiving and processing a trigger message (also referred to as a request) is shown in the example of FIG. 6. Trigger messages may be used to request a behavior be executed with respect to an instance of one or more digital twins in the runtime environment.

The distributed fabric enables a programming model which receives asynchronous trigger messages from both the cloud and the edge, responds to them with executed behaviors. For example, the trigger message service 621 may receive trigger messages via an application programming interface (API) from the asset, a user interface, an application, a system, or the like, register the message, and create an entity in a database (not shown) for the trigger message. The trigger message has input parameters indicating data to be used during the execution of the behavior as well as token information that can be used to represent the trigger message.

The behavior broker 622 is separated by a topic in the diagram and has the job of looking at a capabilities object of each behavior bound to a digital twin template and determining if an instance of the digital twin is capable of performing the behavior. In some embodiments, the capabilities objects of all behaviors of each twin running in the runtime are cataloged in an index in advance rather than having to search through the entire graph database. The behavior broker 622 may match a trigger message up to a capabilities object that advertise the trigger message to which a twin behavior is responsive. For example, the behavior broker 622 may determine that a behavior listed in a trigger message is associated with specific template elements in various templates of multiple digital twins.

The behavior broker 622 may examine a policy object associated with the behavior to determine whether the behavior can be executed at that time based on context associated with the digital twin. For example, the behavior may include certain parameters indicating situations when the behavior can be executed and situations when the behavior can't be executed based on context. The policy (business rule) may also change the action of the behavior. For example, parameters of a behavior may be policy generated and fed into the behavior to add to the input parameters. The behavior broker 622 may also determine input parameters to use (parsing) and validate that they are valid values for the input parameters by comparing the values to a requirements object of the behavior. The requirements object advertises what inputs are needed to run this behavior, what the values are of the inputs, etc.

Each behavior may associated with a capabilities object identifying trigger messages which cause the behavior to execute, a polity object identifying business rules when and where the behavior can execute, and a requirements object identifying values of input parameters that are needed to execute the behavior. Capabilities may be associated with a TemplateElement, and not directly with a behavior. In this example, a TemplateElement may advertise that it has a behavior available to execute its context. A behavior may thus be associated with a multiplicity of TemplateElements and its execution may be conditioned by each association.

If the message broker 622 validates the performance of a behavior, the behavior broker 622 may create a skill execution record which will contain the work product of the behavior and generate an executable script which is sent by a message to the skill execution engine service 623 which runs the script/executable. The executable part of the behavior may have pieces that are re-usable across different behaviors.

The runtime environment works in conjunction with the templates and behaviors to enable the behavioral functionality of the contextual digital twin. The message database 630 is stored in the fabric somewhere and may include a database (e.g., SQL, Blob, etc.) that stores the artifacts of the requests coming in. Meanwhile, the twin graph store 610 is specifically a graph store where the contextual digital twin models live within the runtime environment. The graph database 610 stores templates of digital twins as graph constructs. If a user owns a digital twin template wants to create a new instance, the user may select a button through a user interface which can send a request (trigger message) to the distributed fabric to instantiate a digital twin of this type with these identifiers.

For example, a behavior associated with the instantiation with a particular template may be registered with the fabric (publish/subscribe) to hear specific requests. When the behavior broker 622 receives one of these requests it can starts a chain of behaviors that produce the instance of the digital twin. In this example, a first behavior may pull all of the data needed to instantiate a digital twin instance. This behavior may also trigger some additional requests (recursive tree) which trigger a next behavior with some new information which is picked up by the next layer down in the recursive tree of the graph of the digital twin template. Each individual element of the digital twin instance has a behavior to generate itself. All of the instances elements are created based on graph model of the digital twin template. The behaviors continue to be triggered throughout the graph until all assemblies, sub-assemblies, and components of the digital twin are generated. The result is an instance tree of the specific data of the specific elements of the asset. The next request (trigger message) may be a configuration request which looks at the instance and knows how to deploy the necessary analytics into the fabric (e.g., edge gateway).

The contextual digital twin template aspect of the example embodiments is a significant differentiator from previously known knowledge graph or asset model approaches. Twin templates are designed graph constructs which are intended to provide or encapsulate various capabilities. For example, the template may have a pragmatic entity structure. Here, the template may model the structure (hardware/software/process) of the twinned entity to a degree necessary to accomplish the purposes of the digital twin platform. So, for example, whereas known Asset Models are intended to provide a detailed and comprehensive structural breakdown of an asset, the twin template might only go to the depth of identifying components that provide data or participate in a defined physical processes. The template also provides a mechanism for creating instance Models (see twin instance elements below) corresponding to real world instances of a particular asset. The template provides a container for all behaviors associated with the operation of a digital twin instance.

Figure 7A:
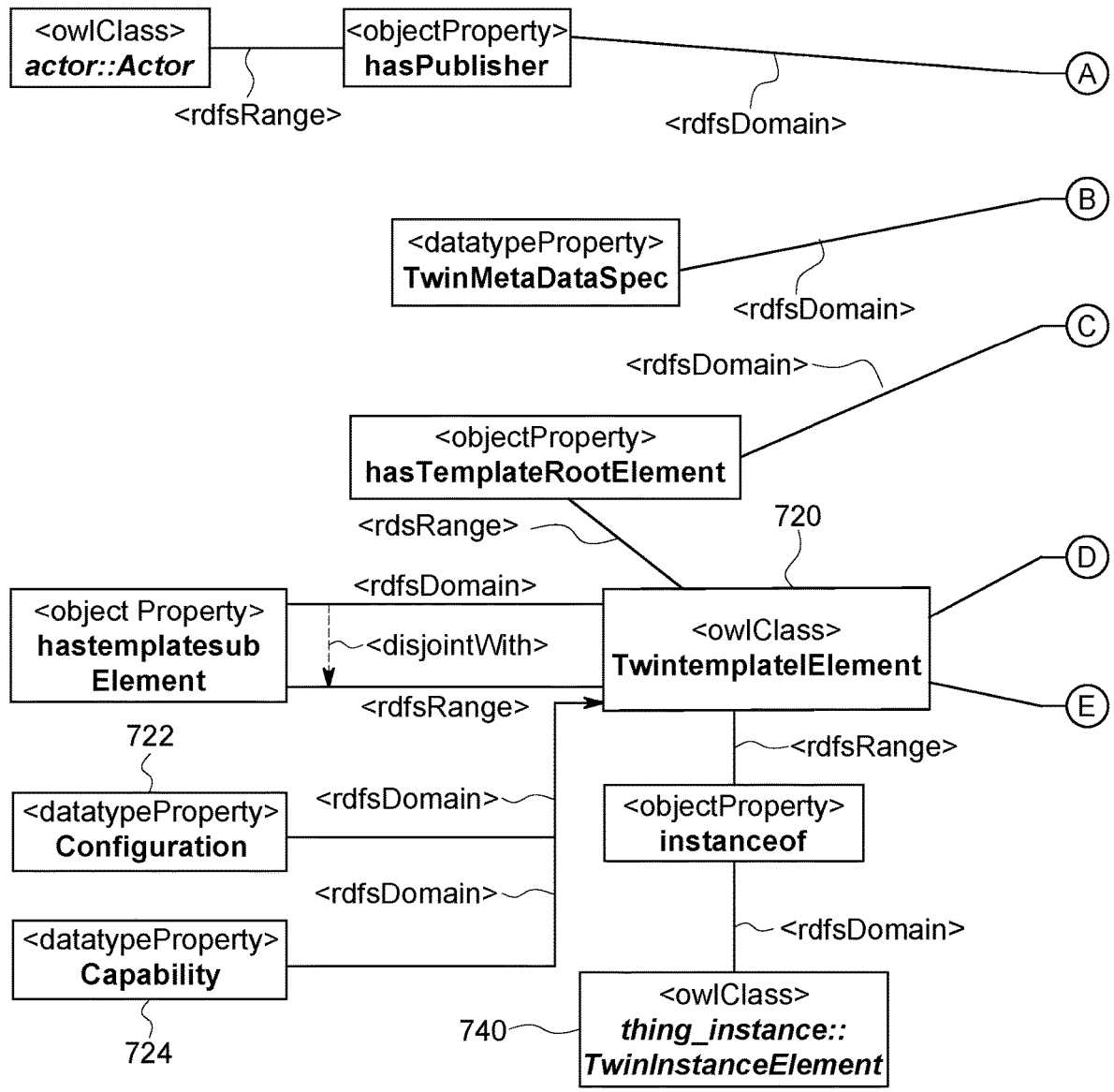
FIGS. 7A and 7B are diagrams illustrating a template for a contextual digital twin in accordance with an example embodiment.
Figure 7B:
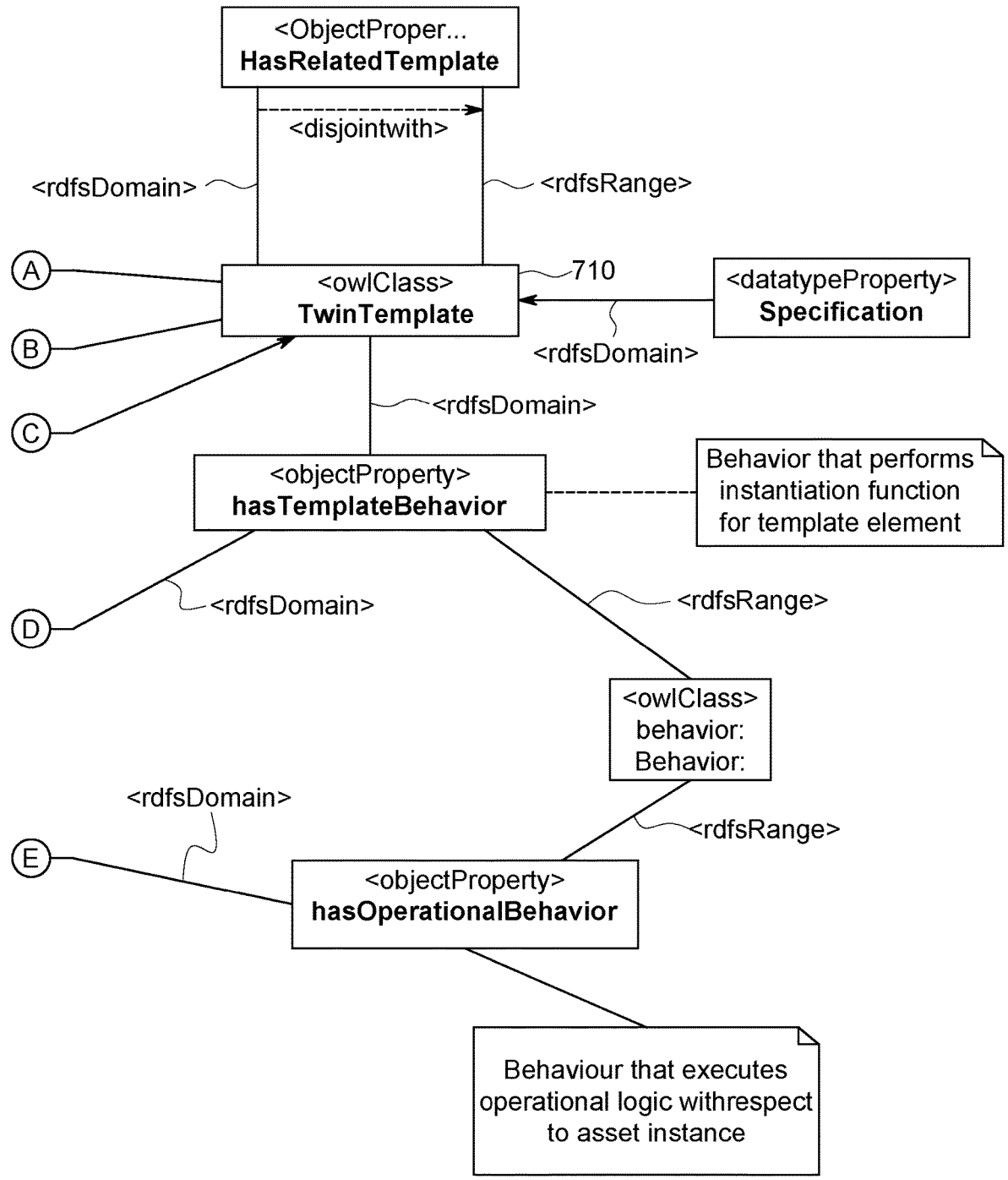

FIG. 7 illustrates a template 710 of a contextual digital twin in accordance with an example embodiment. In this example, the template 710 includes a twin template element 720 and a behavior 730 bound to the twin template element 720. The twin template 710 encompasses template level semantics such as ownership and authorship and includes a TwinMetaDataSpec data object which provides sourcing and parsing and validation guidance with respect to the data required to create specific instances of the twin type. For example, in the case of a twin template for a particular model jet engine, the data required to create a twin instance corresponding to a physical instance of that engine might include serial numbers, dates of manufacture, tested thrust ratings, sensor identifications, etc. In this example, the TwinMetaDataSpec may provide source locations for this data, as well as lists of value names, formats and protocols needed at instance creation time to acquire the data, determine its completeness and validity before proceeding with the instantiation process.

Within the template 710 may a hierarchy of multiple twin template elements 720 while only one is shown in this example for convenience. A twin template element 720 is a semantic heart of the twin template 710, and it relies on a modified composite pattern utilizing simple, highly reusable building blocks in a recursive fashion to describe arbitrarily complex twins. Each twin template element 720 in a hierarchy represents a single instance element in the instance hierarchy and it contains all template and operational behavior on behalf of all corresponding instance element. The template behavior for instantiating a twin template element can be highly parameter driven and thus, for example, a behavior that creates an instance assembly element can be reused throughout the twin template hierarchy to create specific assembly elements based on provided parameters.

The parameters consumed by an instantiation behavior may be derived from a multiplicity of sources including the instance metadata read in by the top-level template element and parsed per the behavior requirements object, the configuration object 722 associated with the specific twin template element 720, and policy driven parameters derived from policies in the behavior policy object. Also attached to the twin template element 720 is a capabilities object 724 identifying trigger messages that the twin template element 720 responds to.

The core ontology definition for twin templates can be directly used to create any type of digital twin such as a twin of a physical structure, a software structure, a process (software or physical) and the like. However, in order to constrain such twin templates to be internally consistent, the example embodiments may implement a sub classing mechanism for each twin type which constrains each such sub classed template to create and operate twins constructed exclusively from twin instance elements of the respective type. The example embodiments explicitly contemplate the construction and operation of thing type templates that include machines, devices, equipment, etc., and system of things type templates (FIG. 9) that encompass a systems of things that operate, or are operated, in concert to achieve a business objective. Such systems of things include, but are not limited to: fleets, facilities, trains, networks, etc. The example embodiments also provide for twin (Software) process type templates which include software processes deployed and/or operated under the auspices of a digital twin including, but not limited to, analytics, systems of analytics, complex event processing workflows, decision support applications, and the like. The other type of templates supported include physical process types such as shown in FIG. 10, resource template types, and actor template types. However, the example embodiments are not limited to these twin template types and may be extended to encompass additional entities.

Figure 8:
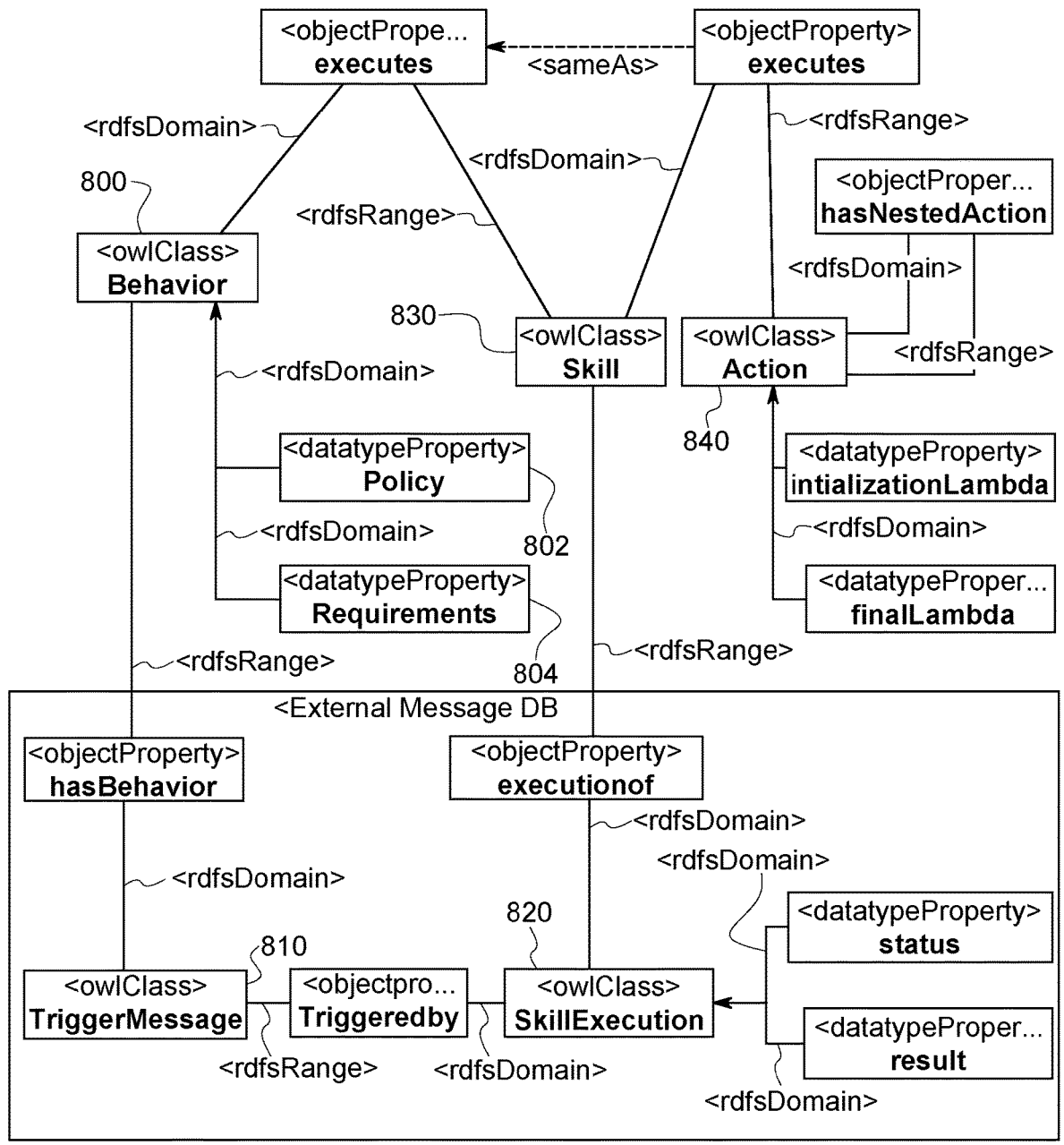
FIG. 8 is a diagram illustrating a template for a behavior of a contextual digital twin in accordance with an example embodiment.

FIG. 8 illustrates a structure 800 of a behavior of a contextual digital twin that can be associated with a twin template in accordance with an example embodiment. The behavior 800 has a policy object 802, a requirements object 804, and actions 840 (which are what the behavior is). It's included in a template 800 because behaviors are associated with a template of a digital twin. Actions 840 may include little snippets of code that take some executable action on a twin or with respect to a twin. A collection of actions 840 is referred to as a "skill" 830 but it may also be referred to as a behavior. Actions 840 do most of the work. Actions may be nested. Actions may be sequenced. It's typically a little piece of JavaScript. The skill execution engine compiles the code and creates the JavaScript that can be executed. The federated part can also call out to a remote system for a federated action to be performed. In the example of FIG. 8, a trigger message 810 triggers execution of behavior 800 including skills 830 that are made up of actions 840 which are added to an executable script and executed by skill execution engine 820 to generate a processing result of the behavior 800.

Actions can also submit trigger messages of their own to the trigger message service and poll for results using a returned UUID. In this way, it is possible to invoke meta-behaviors composed of a cascade of individual behaviors. The example embodiments further include the means to propagate the behavior execution cascade from one digital twin instance to behaviors which reside on other twin templates of other digital twin instances. In this way, individual templates can be coupled to reflect their operation as a system.

The example embodiments include multiple programmatic behaviors including template behaviors and operational behaviors. Template behaviors are the behaviors which are executed in the context of the template itself, in the performance of its responsibilities as a template. For example, template behaviors may be associated with template elements via a hasTemplateBehavior relation. An example of a template behavior is the responsibility for the creation of instances of the template, and the behaviors which work together to achieve this. To facilitate and simplify this process, the twin template has a simple composite pattern whereby each element in the template is represented by a twin template element node which has its own TwinMetaDataSpec and configuration data objects, along with a collection of child template elements which can include 0 or more such elements. The associated template behavior for instantiation reads the MetaDataSpec to enable parsing its particular input parameters from the global input parameters, and reads the configuration object to determine the specific configuration of the twin instance element it is responsible to create. By operating in this highly parameter driven way, a relatively small number of reusable behaviors can support the recursive creation of very complex twin instances. Other template behaviors may include, but are not limited to, behaviors to support template browsing, configuration, and maintenance.

Operational behaviors include behaviors which execute in the context of a specific twin instance. Operational behaviors are thus reusable across any twin instance of a twin template. The template, in this case, is providing a single unified container for runtime behaviors which implement operational capabilities. The behaviors may be associated with twin template elements via a hasOperationalBehavior relation, and the behaviors themselves can navigate to the specific twin instance element via an instanceOf relation.

Figure 9:
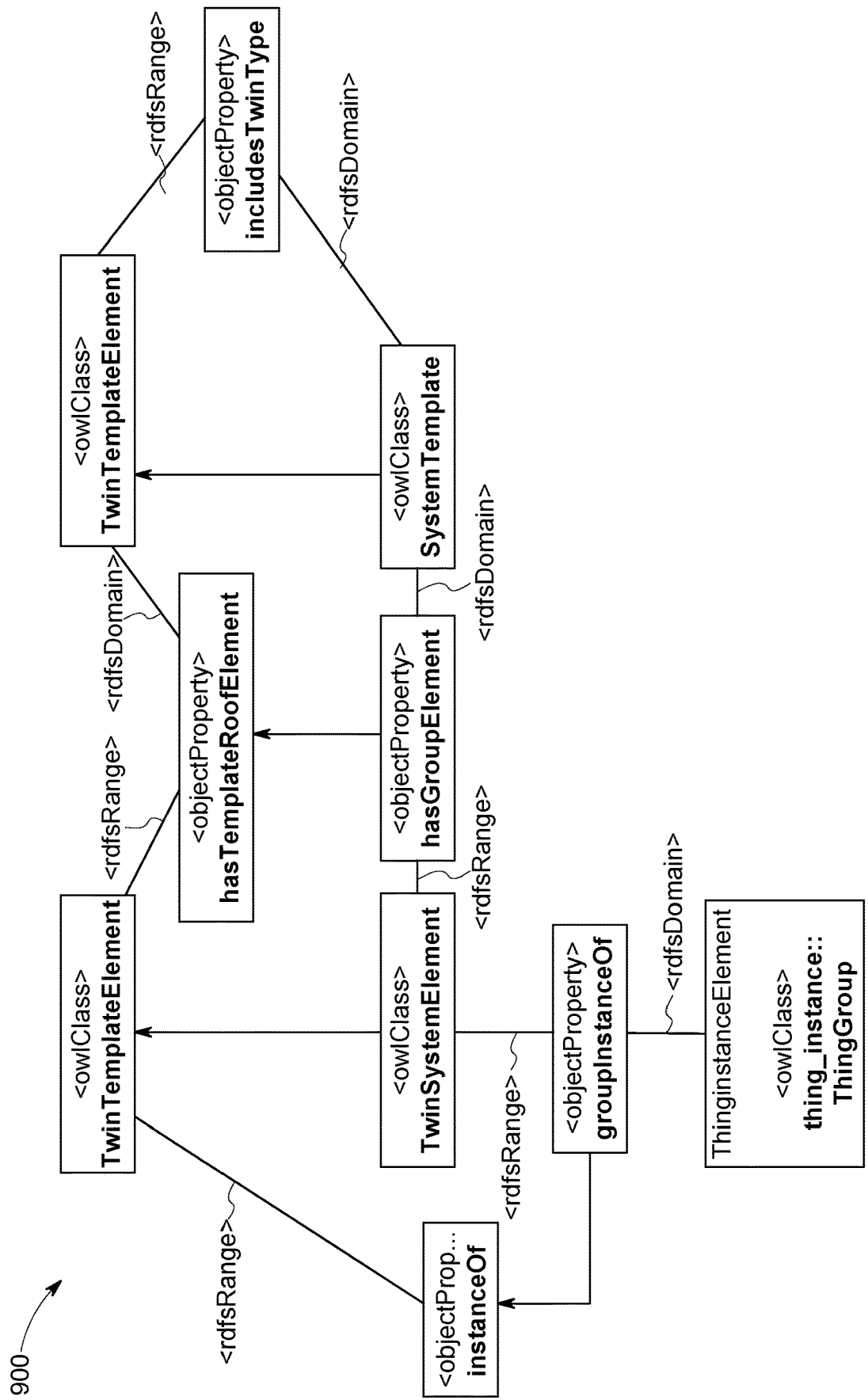
FIG. 9 is a diagram illustrating a template for a system of contextual digital twins in accordance with an example embodiment.
Figure 10:
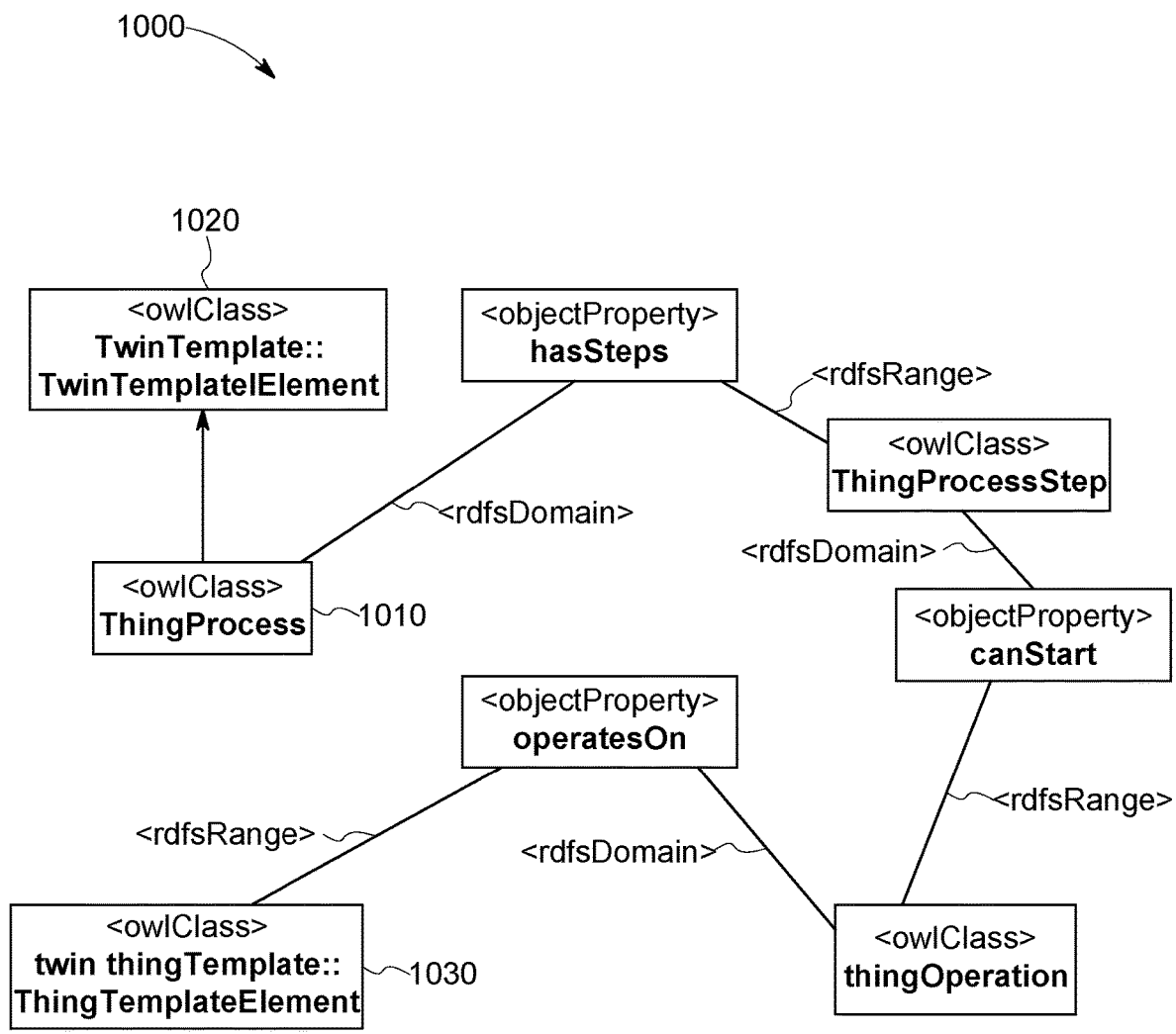
FIG. 10 is a diagram illustrating a template for a process associated with a contextual digital twin in accordance with an example embodiment.

FIG. 9 illustrates a template 900 for a system of contextual digital twins in accordance with an example embodiment. The system may include a hardware asset, a software asset, a process, a resource, or a combination of these types of assets. Often, a single asset isn't delivered to a client, but instead a system of assets that work together and operate as a family are delivered as part of a finished product. In this example, there is a collection of assets which are covered by the template 900. The template 900 includes a twin system element associated with a system template and which is instantiated to generate an instance.

FIG. 10 illustrates a template 1000 for a process associated with a contextual digital twin in accordance with an example embodiment. There are twin processes that are software processes that need to be modeled. The machine assets do processes with respect to each other as well (physical processes). A water pump may pump water to cool a radiator to cool a portion of the radiator and this cooling process can be modeled as an asset process. We want to model not just software processes but the physical processes that go on because they have lifecycles and behaviors.

Figure 11A:
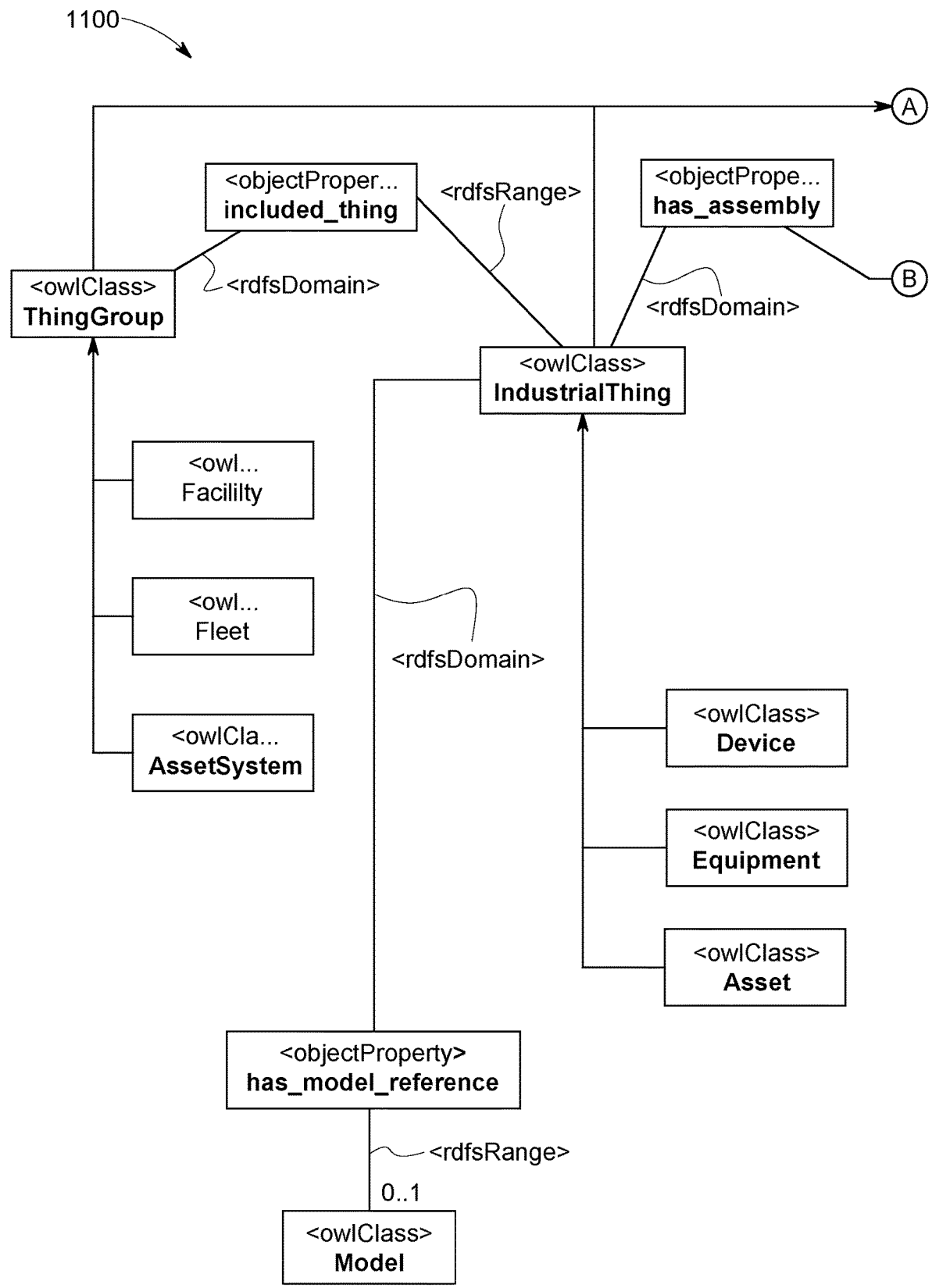
FIGS. 11A, 11B, and 11C are diagrams illustrating instances of a contextual digital twin in accordance with an example embodiment.
Figure 11B:
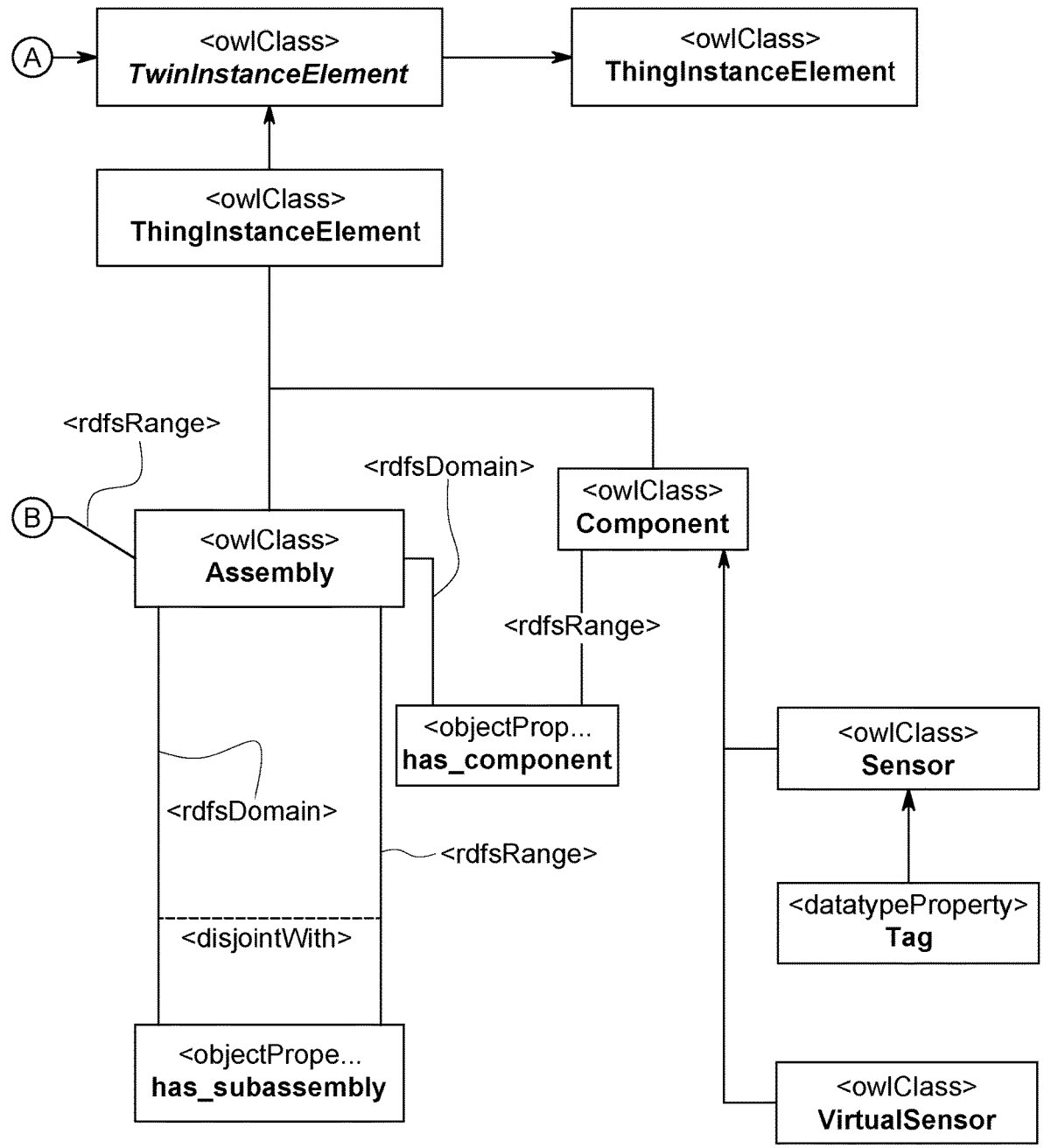
Figure 11C:
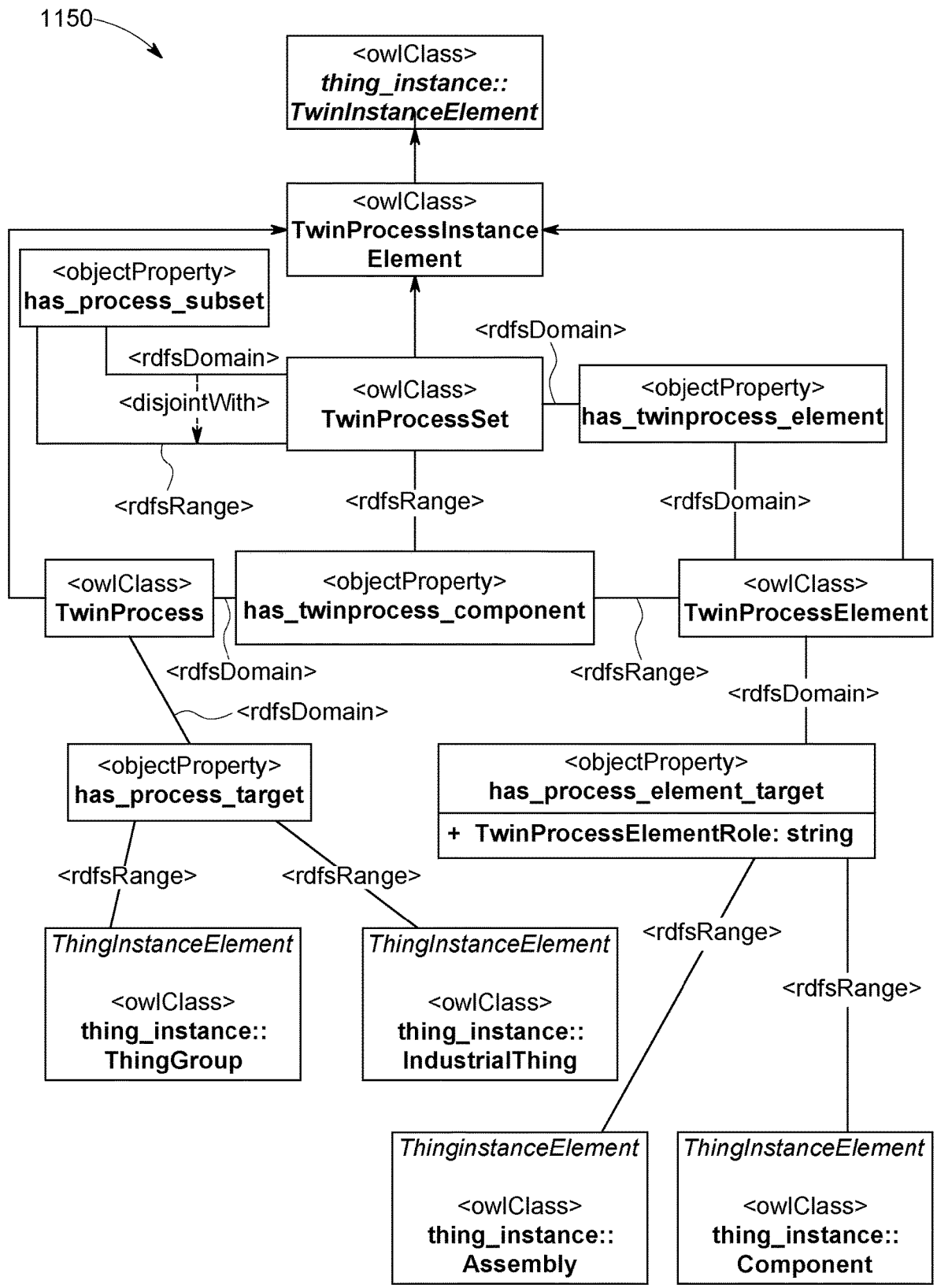

FIGS. 11A and 11B illustrate an architecture 1100 of an instance of a hardware-based contextual digital twin in accordance with an example embodiment and FIG. 11C illustrates an architecture 1150 of software process-based contextual digital twin in accordance with an example embodiment. An instance is a running virtual representation of an actual specific instance of an asset, as opposed to a representation of a type of asset (the template). An instance of a digital twin is run based on the design of the template of the digital twin. In this example, an instance of a thing such as a machine or equipment is used to model the actual entity. An instance may be associated with an instance group and may model a particular thing (machine or equipment). For physical entities, there is a recursive model that can be used to model any entity. The entity may include a structure that includes assemblies and sub-assemblies. For example, a generator may have a pump, a radiator, a magneto, etc. Also, the assemblies and subassemblies include components which can include sensors (and virtual sensors). Any physical entity may be made up of groups, assemblies, sub-assemblies, and components. The model can be finished by simply adding properties to the instance thereby making anything complex into an arbitrary instance model. The purposes of an instance model is to contain the data that distinguishes this instance from any other instance. The behaviors in the instance are taken from the template which includes behaviors of all instances that are of the same type. The particular instance has specific data (model number, manufacturer, upgrades, etc.)

Figure 12:
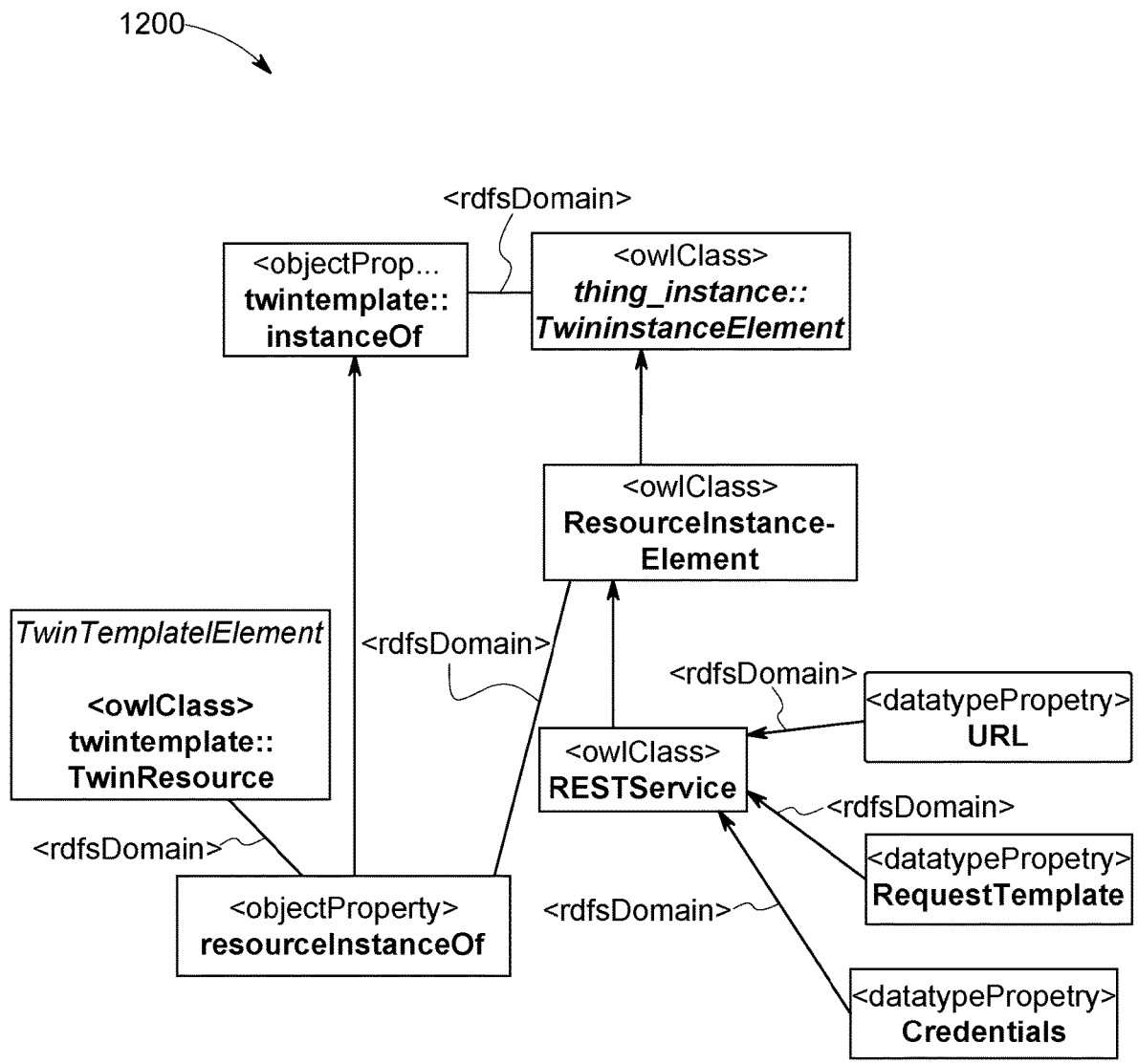
FIG. 12 is a diagram illustrating an architecture of an instance of a resource in accordance with an example embodiment.

FIG. 12 illustrates an architecture 1200 of an instance of a resource in accordance with an example embodiment. For example, a resource may be something external to the system that a digital twin may need to call on, for example, a data source to be called on to run a software, etc. such as a web service, and the like. In this example, a weather service (e.g., weather.com, etc.) can be a resource and the weather service can have behaviors and create domain events. The weather service can also be down or have a failure. The weather service can create instances of the resources.

Figure 13:
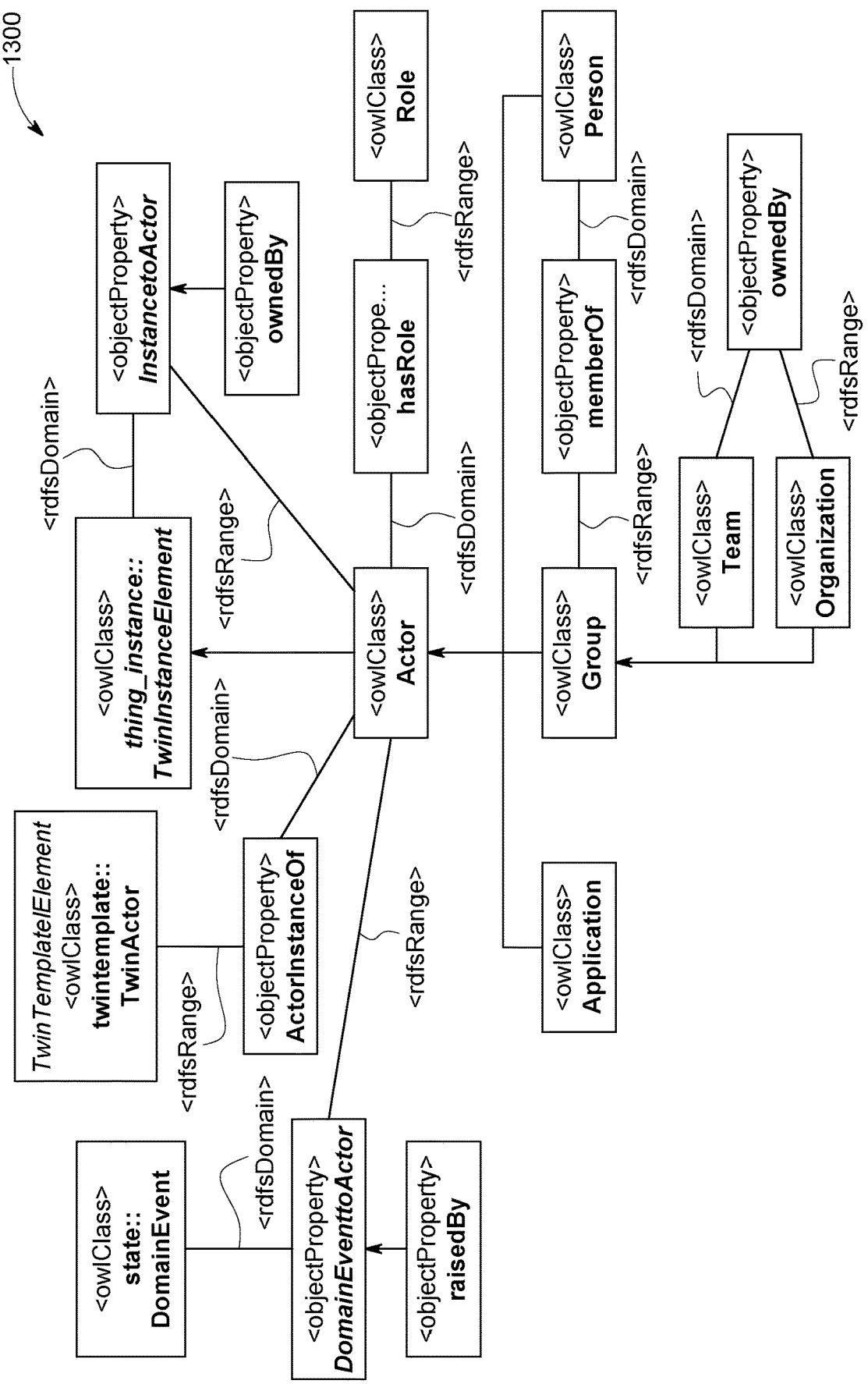
FIG. 13 is a diagram illustrating an architecture of an instance of an actor in accordance with an example embodiment.

FIG. 13 illustrates an architecture 1300 of an instance of an actor in accordance with an example embodiment. Actors have behaviors and a lifecycles. Actors may invoke or otherwise represent features on the system such as human beings, applications, etc. An actor is an entity that can make decisions with respect to a digital twin/asset that factors into how things execute. For example, the domain event semantics of an actor may include this is a person who did this, at this time, to this thing, in this way. Actors have roles which determine whether they are allowed to do certain things. Actors can be people in groups/teams that belong to organizations. In short, the instance of the actor may be used to model external entities that affect behaviors.

Figure 14:
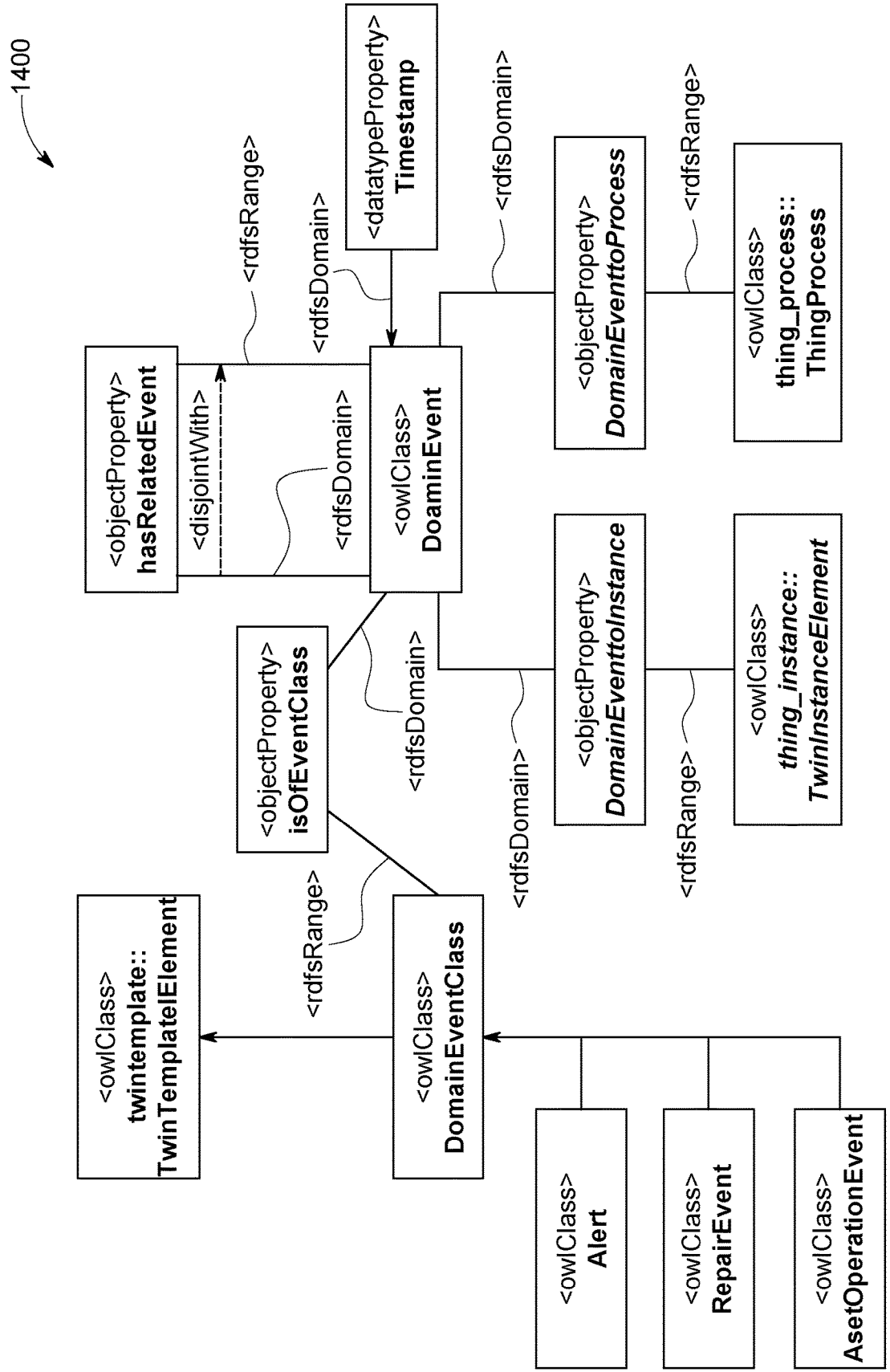
FIG. 14 is a diagram illustrating an architecture of a domain event associated with an instance of a digital twin in accordance with an example embodiment.

FIG. 14 illustrates an architecture 1400 of a domain event associated with an instance of a digital twin in accordance with an example embodiment. A domain event is dynamic and can be used to represent semantics associated with a contextual digital twin. Domain events are principally about state over time from the operation of the asset. Meanwhile, information may be encapsulated in its own knowledge artifact. An example of a domain event is a machine being turned on. The semantics are who turned it on, why did they turn it on, when did they turn it on, etc. The semantics might be that it was turned on because of an alert. What was the source of the alert, who was called to deal with it, when was the alert/emergency over, etc. The domain event can model semantics for anything that happens on the digital twin. The semantics for a specific Domain Event are stored in the DomainEventClass, and behaviors associated with said DomainEventClass use these semantic specifications to create and semantically integrate each instance of a DomainEventClass. A domain event may provide a state history of an asset in detail with a rich set of semantics that explain what happen without having to do some detailed data extraction. Instead, the information is provided as knowledge and made explicit. This is very powerful because the semantics can be used to discover patterns, provide insight, and generate context. The domain events organically grow as the system runs.

Figure 15:
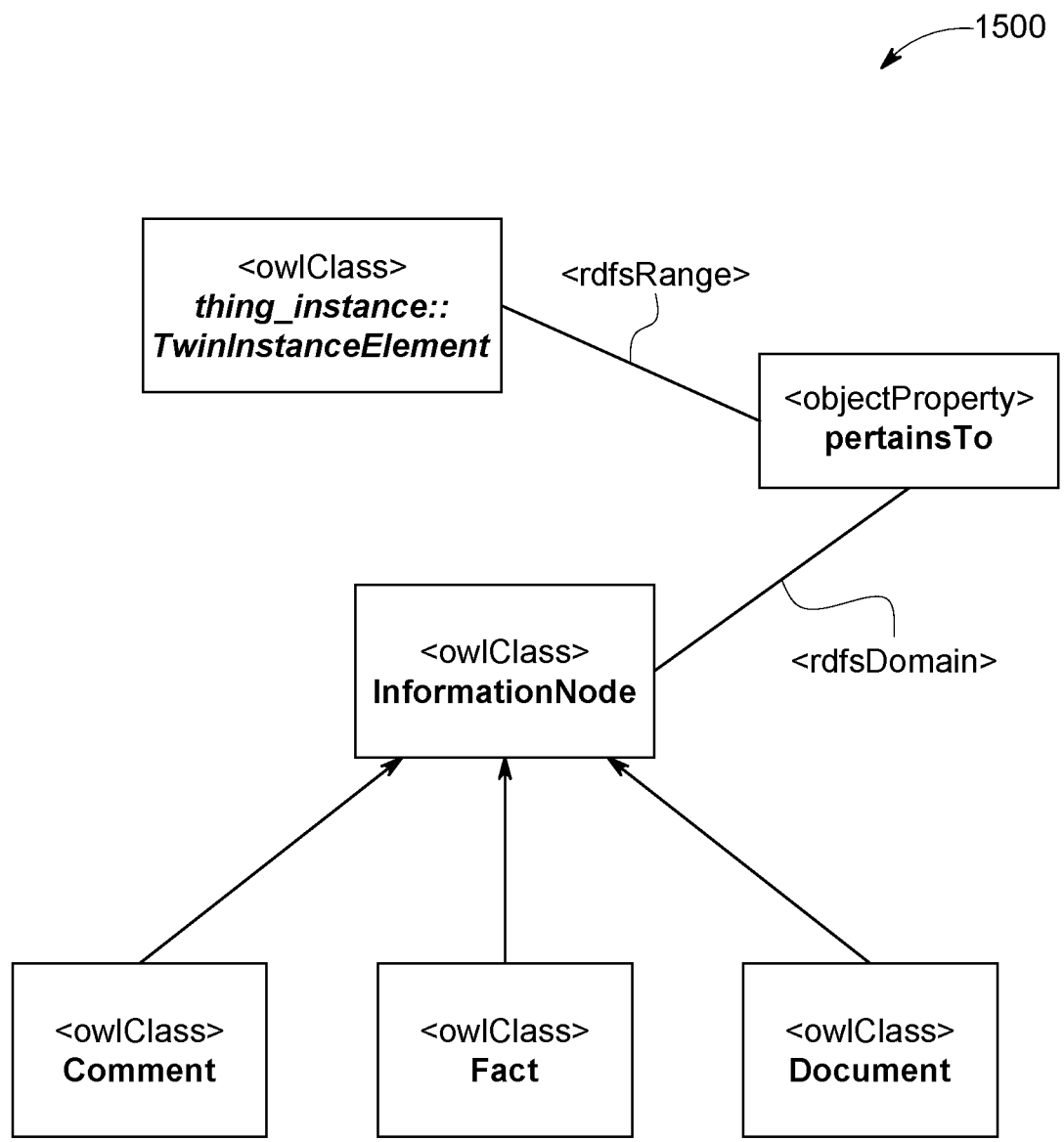
FIG. 15 is a diagram illustrating an architecture of an information resource in accordance with an example embodiment.

FIG. 15 illustrates an architecture 1500 of an information resource in accordance with an example embodiment. Information resources include documents such as case management, manuals, instructions, etc. which each have semantics associated with it. The document may pertain to a particular asset or assembly, and may have an author, etc. The system may not store the actual document but may store metadata that says there exists a document in relation to these entities with this kind of information included therein. A user may also query the document. Another type of information node is comments provided from humans (notes, repairs, orders, etc.) and who made the comment.

Figure 16:
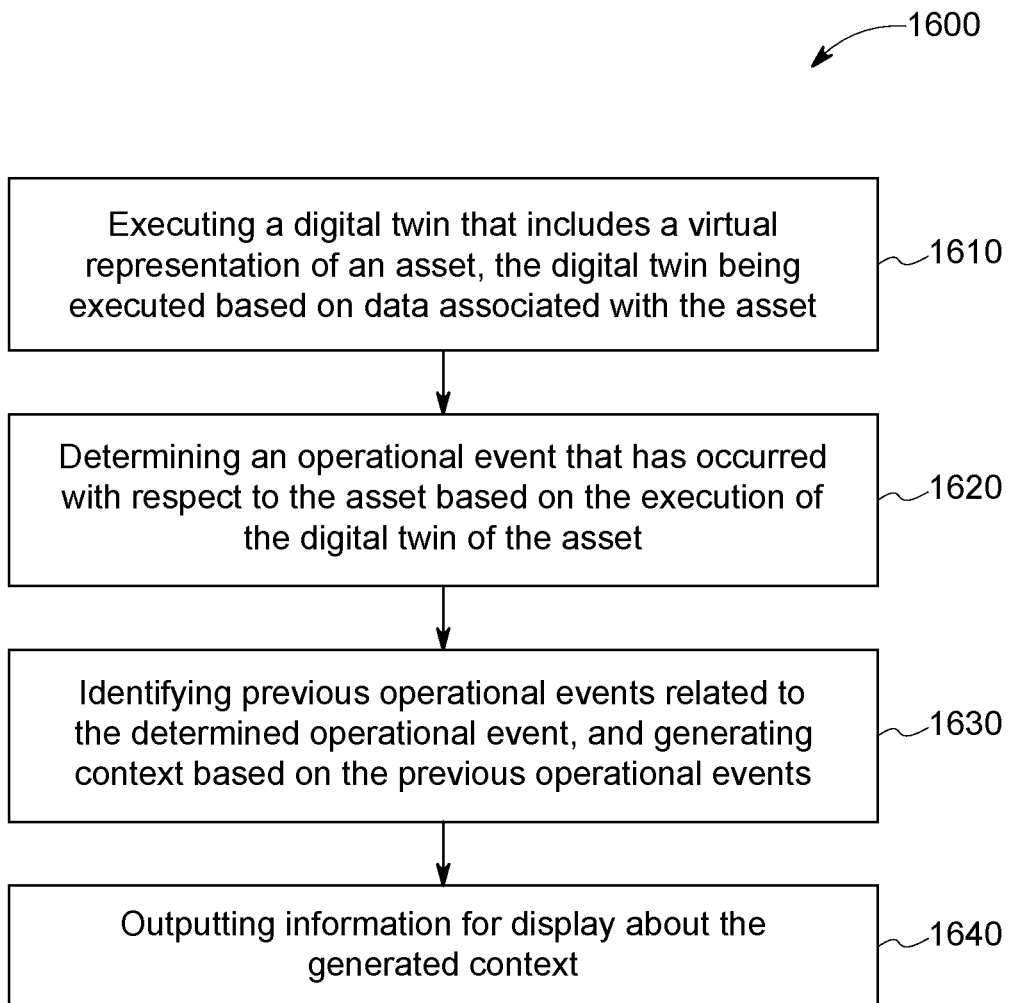
FIG. 16 is a diagram illustrating a method of generating and outputting context of a digital twin in accordance with an example embodiment.

FIG. 16 illustrates a method 1600 of generating and outputting context of a digital twin in accordance with an example embodiment. The method 1600 may be performed by a computing system or group of computing systems such as the host platform 120 shown in FIG. 1 which may be a web server, a cloud platform, an on-premises device, and the like. Referring to FIG. 16, in 1610 the method includes executing a digital twin which comprises a virtual representation of an asset (or a plurality of twins representing a plurality of assets). For example, the digital twin may be executed based on data associated with the asset such as raw data (e.g., time series data) received directly from the asset or other data collected from the asset or other sources such as databases, operators, applications, analytics, and the like. The asset may include a physical structure such as a wind turbine, a jet airplane, an oil rig, a healthcare machine, or the like. As another example, the asset may include a software program such as an application, an analytic, a group of software programs or the like. As another example, the asset may include a process that is performed with respect to the asset by a physical actor or an application. As another example, the asset may include a system of assets that may be monitored together which can include hardware, software, processes, or a combination thereof.

In 1620, the method includes determining an operational event that has occurred with respect to the asset based on the execution of the digital twin of the asset. The determined operational event may have an effect on the asset in some way. For example, the determined operational event may include an alert generated with respect to the asset, a failure detected with respect to the asset, a case generated in association with the asset, and the like. Cases are often used by digital twin systems to notify an operator that an issue or a situation has arisen with respect to the asset (e.g., a part needs to be ordered, repairs are needed, worker has sent a notification, weather event, etc.) Any type of event that has some impact on the operation of an asset can be an operational event. In some embodiments, the determined operational event is associated with a particular component of the asset (e.g., assembly, sub-assembly, component, part, etc.) As another example, the operational event may be associated with a particular operator of the asset, an informational resource of the asset, and the like.

In 1630, the method includes identifying previous operational events that have occurred and that are related to the determined operational event, and generating context for the determined operational event based on the previous operational events, and in 1640, the method includes outputting information for display about the generated context of the determined operational event to a display device. For example, the previous operational events may include one or more of operational events that previously occurred with respect to the asset and/or operational events that previously occurred with respect to another asset that is a same type as the asset (e.g., another wind turbine of a same type but a different model number, etc.)

In some embodiments, the generating of the context may include generating a description about a previous operational event that occurred to the particular component. As another example, the generating the context for the determined operational event comprises generating one or more of suggestions about what needs to be performed to address the determined operational event, a person to perform an activity in response to the determined operational event, a machine or equipment to be used to perform the activity in response to the determined operational event, and a document to be viewed to address the determined operational event. For example, the generated description may include a description of a cause of the previous operational event, what was performed in response to the operational event, how the response was performed, and a result of the response being performed. Here, the previous operational event may have occurred to a same type of component on another asset or the same component on the same asset. In some embodiments, the generated description further comprises a description of a difference between the previous operational event that was detected and the determined operational event.

Figure 17:
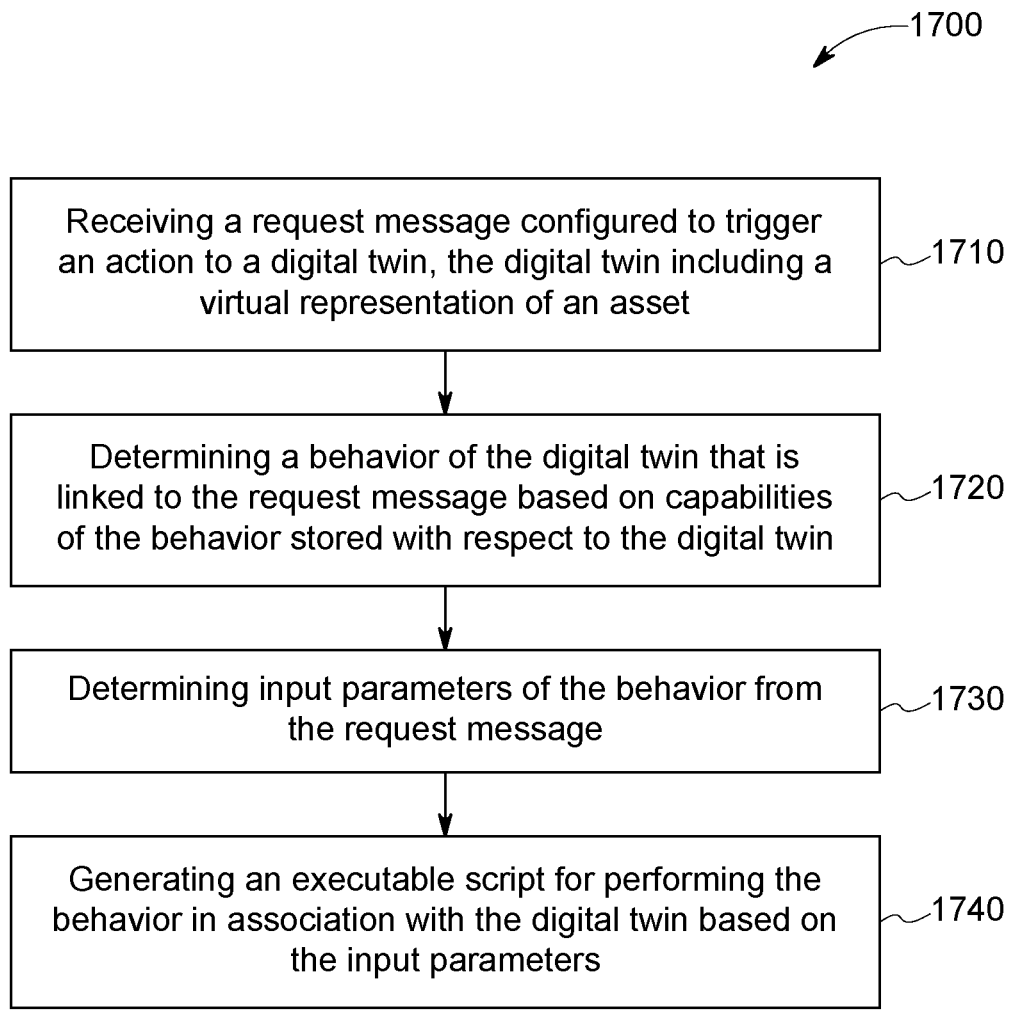
FIG. 17 is a diagram illustrating a method of managing a runtime environment for a contextual digital twin in accordance with an example embodiment.

FIG. 17 illustrates a method 1700 of managing a runtime environment for a contextual digital twin in accordance with an example embodiment. The method 1700 may be performed by a computing system or group of computing systems such as the host platform 120 shown in FIG. 1 which may be a web server, a cloud platform, an on-premises device, and the like. Referring to FIG. 17, in 1710, the method includes receiving a request message configured to trigger an action to a digital twin. Here, the digital twin includes a virtual representation of an asset. The request message may be a trigger message or another request that identifies a behavior that is to be executed with respect to a digital twin.

In 1720, the method includes determining a behavior of the digital twin that is linked to the request message based on capabilities of the behavior stored with respect to the digital twin. For example, the behavior (behavioral program) may be a programming model that is attached to a graph of a digital twin template. When executed, the behavior may perform an operation or a method with respect to an instance of the digital twin corresponding to the digital twin template. For example, the behavior may include a method of initially launching and deploying an instance of the digital twin. As another example, the behavior may include a method of configuring one or more operating parameters of an already running instance of the digital twin. As another example, the behavior may include performing an operation of the digital twin such as rotating a blade, running an engine, refueling, etc.

In some embodiments, the behaviors of a contextual digital twin may be advertised via a catalogue that includes advertisements of respective behaviors of all other digital twins included in the system. In some embodiments, the capabilities of the behavior may include request message types capable of triggering the execution of the behavior and the request message types may stored in a capabilities object associated with the behavior. Here, the system may receive a request message with a behavior type included therein and match the request message to an instance of a digital twin (and its template) that subscribes or is matched to the behavior type based on a capabilities object stored in the template of the instance of the digital twin. In some embodiments, the method may further include extracting policy parameters of the behavior from a policy object of the behavior, and determining whether the behavior can be executed based on the extracted policy parameters of the behavior. In some embodiments, the determining may determine a plurality of behaviors that are linked to the request message based on respective capabilities objects of each of the plurality of behaviors which are stored in the digital twin template.

In 1730, the method further includes determining input parameters of the behavior from the request message, and in 1740, generating an executable script for performing the determined behavior in association with the digital twin based on the input parameters. The input parameters may identify data that is needed to execute the behavior such as data from the asset, data from an application, stored data, and the like. In some embodiments, the method may further include outputting the executable script to an execution engine for executing the executable script with respect to an instance of the digital twin.

Figure 18:
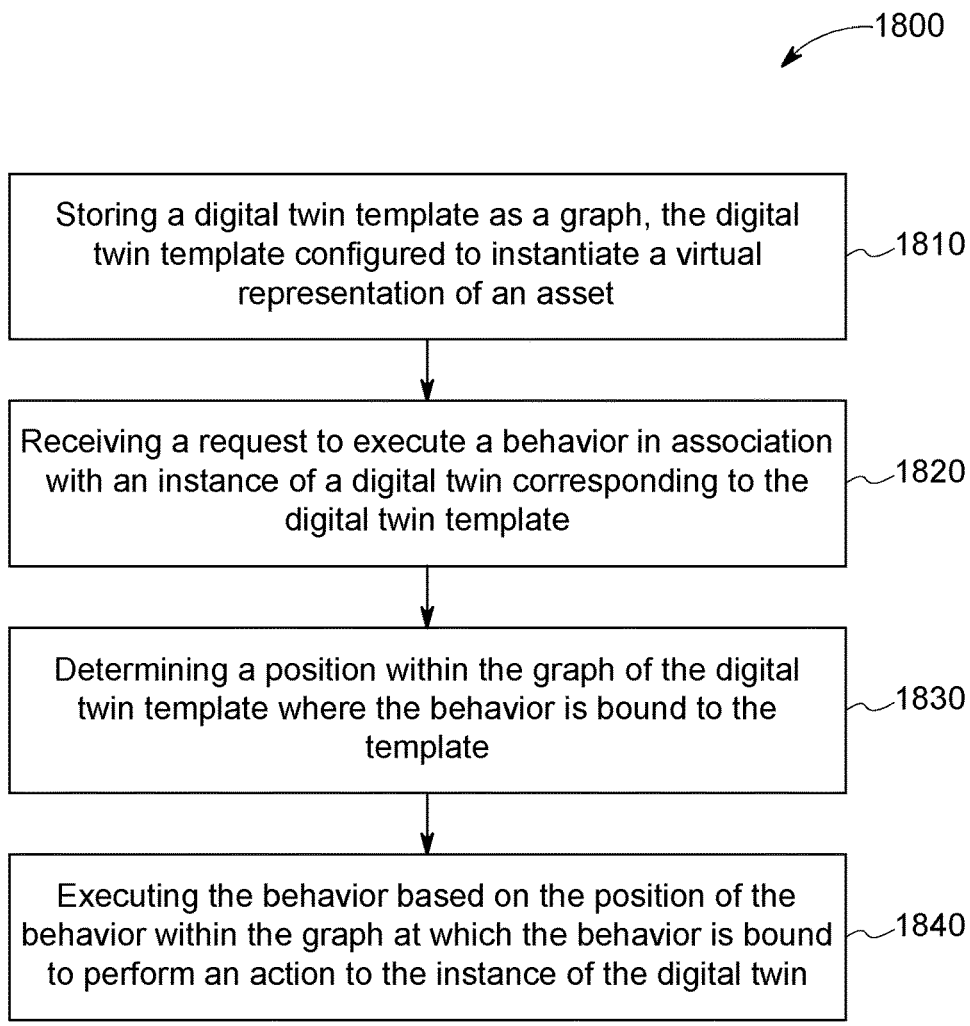
FIG. 18 is a diagram illustrating a method for executing a behavior associated with a contextual digital twin in accordance with an example embodiment.

FIG. 18 illustrates a method 1800 for executing a behavior associated with a contextual digital twin in accordance with an example embodiment. The method 1800 may be performed by a computing system or group of computing systems such as the host platform 120 shown in FIG. 1 which may be a web server, a cloud platform, an on-premises device, and the like. Referring to FIG. 18, in 1810 the method includes storing a digital twin template as a graph model in a database where the digital twin template configured to instantiate a virtual representation of an asset.

For example, the template may be a graph construct that is shaped in the form of a tree. In this example, the graph model of the digital twin may include a recursive tree including a plurality of nodes linked together in a hierarchy where each node represents a component of the digital twin template.

In 1820, the method includes receiving a request to execute a behavior in association with an instance of a digital twin corresponding to the digital twin template. For example, the request may be a trigger message or a request triggered by a user via a user interface, an application making an automatic request, and the like. In 1830, the method includes determining a position within the graph model of the digital twin template at which the behavior is bound to the digital twin template, and in 1840, executing the behavior based on the position within the graph model at which the behavior is bound to perform an action with respect to the instance of the digital twin.

According to various aspects, the behavior may be executed differently depending on whether the behavior is bound to a first position of the graph model or a second position of the graph model. For example, if the behavior is bound to an assembly it may execute differently than when it is bound to a sub-assembly or the like. In some embodiments, the executing the behavior may include initially launching and deploying the instance of the digital twin corresponding to the digital twin template. As another example, the executing the behavior may include performing an operational behavior on the digital twin to correspond to an operational behavior that occurs on the asset. Also, the executing the behavior on the instance of the digital twin triggers the execution of one or more of another behavior bound to the graph model of the digital twin template and a behavior bound to a different digital twin template.

In some embodiments, the determining may further include determining context of the asset, and the executing the behavior on the instance of the digital twin is based on the position within the graph model at which the behavior is bound to the digital twin template and based on the context of the asset. As a non-limiting example, the context may include instance-specific information about one or more of a unique model number of the asset, a larger unique assembly including the asset, operating conditions associated with the asset, upgrades or modifications made to the asset, and the like. The context may be specific to that instance of that asset which will differ from other instances representing other assets.

Figure 19:
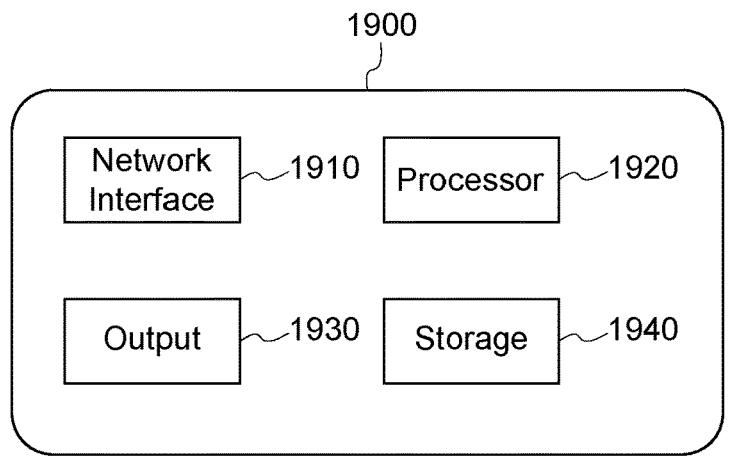
FIG. 19 is a diagram illustrating a computing system for managing a contextual digital twin in accordance with an example embodiment.

FIG. 19 illustrates a computing system 1900 for managing a contextual digital twin in accordance with an example embodiment. For example, the computing system 1900 may be a database, cloud platform, streaming platform, user device, and the like. As a non-limiting example, the computing system 1900 may be the cloud platform 120 shown in FIG. 1. In some embodiments, the computing system 1900 may be distributed across multiple devices. Also, the computing system 1900 may perform any of the methods 1600, 1700 and 1800. Referring to FIG. 19, the computing system 1900 includes a network interface 1910, a processor 1920, an output 1930, and a storage device 1940 such as a memory. Although not shown in FIG. 19, the computing system 1900 may include other components such as a display, an input unit, a receiver, a transmitter, an application programming interface (API), and the like, all of which may be controlled or replaced by the processor 1920.

The network interface 1910 may transmit and receive data over a network such as the Internet, a private network, a public network, and the like. The network interface 1910 may be a wireless interface, a wired interface, or a combination thereof. The processor 1920 may include one or more processing devices each including one or more processing cores. In some examples, the processor 1920 is a multicore processor or a plurality of multicore processors. Also, the processor 1920 may be fixed or it may be reconfigurable. The output 1930 may output data to an embedded display of the computing system 1900, an externally connected display, a display connected to the cloud, another device, and the like. The storage device 1940 is not limited to a particular storage device and may include any known memory device such as RAM, ROM, hard disk, and the like, and may or may not be included within the cloud environment. In some embodiments, the storage 1940 may include a graph database for storing templates of contextual digital twins and the associated elements thereof. The storage 1940 may store software modules or other instructions which can be executed by the processor 1920 to perform the methods described herein. Also, the storage 1940 may store software programs and applications which can be downloaded and installed by a user. Furthermore, the storage 1940 may store and the processor 1920 may execute an application marketplace that makes the software programs and applications available to users that connect to the computing system 1900.

According to various embodiments, the processor 1920 may execute or otherwise run a digital twin which includes a virtual representation of an asset. The asset may be one or more assets, and may be a virtual representation of a hardware structure, a software program, a process, a resource, and the like. The processor 1920 may determine an operational event has occurred with respect to the asset based on the execution of the digital twin of the asset. Operational events include alerts being generated for failures of the asset, maintenance or repairs to be performed, and the like. The processor 1920 may identify previous operational events that have occurred and that are related to the operational event, and generate context for the operational event based on the previous operational events.

For example, the context generated by the processor 1920 may include a listing of similar events that occurred to the asset or to other related assets, how those events were handled, who handled those events, what was the result, what were the differences, and the like. The context can provide an operator with a rich understanding of not only the current issue but also how similar previous issues have been handled and the results. The output 1930 may output information for display about the generated context of the determined operational event to a display device. For example, the output information may be a model of the contextual digital twin output in virtual space and displayed via a display of the computing system 1900 or a display of another device which is connected to the computing system 1900 via a network or a cable. Also output with the virtual model may be a listing or a notification of the context.

As another example, the processor 1920 may receive a request message configured to trigger an action to a digital twin, the digital twin comprising a virtual representation of an asset. The request message (also referred to as a trigger message) may identify one or more actions to be performed. The processor 1920 may determine whether a digital twin has one or more behaviors that are linked to the request message based on capabilities of the behaviors stored with respect to the digital twin in the digital twin template. The processor 1920 may determine input parameters of the behavior from the request message, and generate an executable script for performing the determined behavior in association with the digital twin based on the input parameters.

In some embodiments, the storage 1940 may include a graph database that is configured to store a digital twin template as a graph model. Here, the digital twin template may be configured to instantiate a virtual representation of an asset or a plurality of assets. The processor 1920 may receive a request to execute a behavior in association with an instance of a digital twin corresponding to the digital twin template, determine a position within the graph model of the digital twin template at which the behavior is bound to the digital twin template, and execute the behavior based on the position within the graph model at which the behavior is bound to perform an action with respect to the instance of the digital twin. The executed behavior may generate an operational event with respect to the instance of the digital twin.

Non-limiting examples of various use cases of the contextual digital twin system are provided further herein. GE provides a transportation's trip optimizer utility is used to optimize route and speed plans for a given train trip. Today it is run once prior to start of trip and provides a plan using a fixed algorithm based on a generalized, static model of the train, and a static terrain model of the available rail routes. Thus, the current product is not responsive to specific history and dynamic conditions. By modeling the application as a machine learning based twin process, coupled with contextual digital twins of actual trains and rail systems, and adding dynamic data from external resource twins, a train operator can be fed a dynamic stream of trip plan updates that reflect the actual condition and history of all elements as well as weather, traffic and other changing external conditions along a route in real time. In addition, the multivariable machine learning aspect of a twin process can produce much more nuanced and experience based recommendations. In this way, the experience considers the condition, history and configuration of the actual locomotive and railway involved.

As another example, GE provides an Asset Performance Management (APM) application suite that includes an Alarm Evaluation Application which is used to evaluate the stream of alarms from asset monitoring systems such as GE's smart signal. A large majority of the time and energy of alarm evaluation operators is devoted to eliminating false positives (i.e., alarms that can safely be ignored.) Another contextual digital twin use case applies a machine learning algorithm to reason over domain events corresponding to alarms, along with the domain events corresponding to the condition history of the asset and twin Process (e.g., smart signal) in the context of the physical process twin of the asset to automatically eliminate a large majority of alarm false positives before involving a human operator.

Aviation Analytics Based Maintenance (ABM) is a sophisticated system of analytics targeted at a singular key performance indicator (KPI) in order to reduce cost of maintenance of jet engines. Analyzing the condition of a jet engine in order to provide maintenance recommendations requires correlation of an array of contributing factors from multiple data silos, many of which affect each other. For example, the condition of a jet engine depends heavily on its history of flight paths, weather encountered during those flights, previous maintenance and repair records, design specification of various parts of the engine etc. Current ABM prediction can be greatly improved by surfacing a correlated view of the history of the information domain and resulting KPIs to reveal the relative importance of each contributing factor, and the impact of variations in accuracy and availability of each factor. The contextual digital twin platform addresses this need by providing digital twin models of the asset (jet engine), process, and information resources involved in ABM operation, and accumulating related state and condition events as the process operates over time. In this way, the operator is provided with a comprehensive view of the history of the operating ABM process and its generated KPI. Also, a pattern matching aspect of this use case would be that when a user application connects, the system could identify the set of recent low points in KPI, and identify the conditions which are common across them (e.g. whenever weather data is sourced from yahoo weather rather than weather.com, the ABM KPIs in certain regions of operation drop off).

As will be appreciated based on the foregoing specification, the above-described examples of the disclosure may be implemented using computer programming or engineering techniques including computer software, firmware, hardware or any combination or subset thereof. Any such resulting program, having computer-readable code, may be embodied or provided within one or more non-transitory computer readable media, thereby making a computer program product, i.e., an article of manufacture, according to the discussed examples of the disclosure. For example, the non-transitory computer-readable media may be, but is not limited to, a fixed drive, diskette, optical disk, magnetic tape, flash memory, semiconductor memory such as read-only memory (ROM), cloud storage, a communication network, or the like. The article of manufacture containing the computer code may be made and/or used by executing the code directly from one medium, by copying the code from one medium to another medium, or by transmitting the code over a network.

The computer programs (also referred to as programs, software, software applications, "apps", or code) may include machine instructions for a programmable processor, and may be implemented in a high-level procedural and/or object-oriented programming language, and/or in assembly/machine language. As used herein, the terms "machine-readable medium" and "computer-readable medium" refer to any computer program product, apparatus, cloud storage, internet of things, and/or device (e.g., magnetic discs, optical disks, memory, programmable logic devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal that may be used to provide machine instructions and/or any other kind of data to a programmable processor.

The above descriptions and illustrations of processes herein should not be considered to imply a fixed order for performing the process steps. Rather, the process steps may be performed in any order that is practicable, including simultaneous performance of at least some steps. Although the disclosure has been described in connection with specific examples, it should be understood that various changes, substitutions, and alterations apparent to those skilled in the art can be made to the disclosed embodiments without departing from the spirit and scope of the disclosure as set forth in the appended claims.

What is claimed is:
1. A computer-implemented method comprising:
   receiving a request message configured to trigger an action to a digital twin, the digital twin comprising a virtual representation of an asset which is created by executing a graph-based template of the digital twin;

determining a plurality of behaviors of the digital twin that are linked to the request message based on respective capabilities of each of the plurality of behaviors which are stored in a capabilities object that is bound to a graph of the graph-based template of the digital twin and which advertise as being responsive to the request message;

determining input parameters of the plurality of behaviors from the request message; and generating an executable script for performing the plurality of behaviors in association with the digital twin based on the input parameters.

2. The computer-implemented method of claim 1, wherein the plurality of behaviors include a method of initially launching an instance of the digital twin.

3. The computer-implemented method of claim 1, wherein the plurality of behaviors include a method of configuring one or more operating parameters of an already running instance of the digital twin.

4. The computer-implemented method of claim 1, further comprising executing the executable script with respect to an instance of the digital twin.

5. The computer-implemented method of claim 4, further comprising outputting a result of the execution of the executable script for display with respect to a display of the instance of the digital twin.

6. The computer-implemented method of claim 1, wherein the plurality of behaviors of the digital twin are advertised via a catalogue that includes advertisements of respective behaviors of multiple other digital twins.

7. The computer-implemented method of claim 1, wherein capabilities of a behavior comprise an identification of request message types capable of triggering the execution of the behavior and the identification of the request message types are stored in the capabilities object.

8. The computer-implemented method of claim 1, further comprising extracting policy parameters of the plurality of behaviors from a policy object bound to the graph of the graph-based digital twin template, and determining whether the plurality of behaviors can be executed based on the extracted policy parameters.

9. The computer-implemented method of claim 1, wherein the determining that the plurality of behaviors are linked to the request message comprises determining that the plurality of behaviors subscribe to the request message based on the capabilities of the plurality of behaviors.

10. A computing system comprising:
a receiver configured to receive a request message configured to trigger an action to a digital twin, the digital twin comprising a virtual representation of an asset which is created by executing a graph-based template of the digital twin; and
a processor configured to
determine a plurality of behaviors of the digital twin that are linked to the request message based on respective capabilities of each of the plurality of behaviors which are stored in a capabilities object that is bound to a graph of the graph-based template of the digital twin and which advertise as being responsive to the request message,
determine input parameters of the plurality of behaviors from the request message, and
generate an executable script for performing the plurality of behaviors in association with the digital twin based on the input parameters.

11. The computing system of claim 10, wherein the plurality of behaviors include a method of initially launching and deploying an instance of the digital twin.

12. The computing system of claim 10, wherein the plurality of behaviors include a method of configuring one or more operating parameters of an already running instance of the digital twin.

13. The computing system of claim 10, wherein the processor is further configured to execute the executable script with respect to an instance of the digital twin.

14. The computing system of claim 10, wherein the plurality of behaviors of the digital twin are advertised via a catalogue that includes advertisements of respective behaviors of multiple other digital twins.

15. The computing system of claim 10, wherein capabilities of a behavior comprise an identification of request message types capable of triggering the execution of the behavior and the identification of the request message types are stored in the capabilities object.

16. The computing system of claim 10, wherein the processor is further configured to extract policy parameters of the plurality of behaviors from a policy object bound to the graph of the graph-based digital twin template, and determine whether the plurality of behaviors can be executed based on the extracted policy parameters.

17. The computing system of claim 10, wherein the processor is configured to determine that the plurality of behaviors are linked to the request message by determining that the plurality of behaviors subscribe to the request message based on the capabilities of the plurality of behaviors.

18. A non-transitory computer readable medium having stored therein instructions that when executed cause a computer to perform a method comprising:
receiving a request message configured to trigger an action to a digital twin, the digital twin comprising a virtual representation of an asset which is created by executing a graph-based template of the digital twin;
determining a plurality of behaviors of the digital twin that are linked to the request message based on respective capabilities of each of the plurality of behaviors which are stored in a capabilities object that is bound to a graph of the graph-based template of the digital twin and which advertise as being responsive to the request message;
determining input parameters of the plurality of behaviors from the request message; and
generating an executable script for performing the plurality of behaviors in association with the digital twin based on the input parameters.

19. The computer-implemented method of claim 1, wherein the generating comprises generating the executable script based on a position of the graph at which the capabilities object is bound.

* * * * *